(12) United States Patent  (10) Patent No.: US 6,535,451 B2
Sekiguchi et al.  (45) Date of Patent: Mar. 18, 2003

(54) SEMICONDUCTOR MEMORY

(75) Inventors: Tomonori Sekiguchi, Kokubunji (JP); Kazuhiko Kajigaya, Iruma (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/810,574

(22) Filed: Mar. 19, 2001

(65) Prior Publication Data

US 2001/0028592 A1 Oct. 11, 2001

(30) Foreign Application Priority Data

Mar. 29, 2000  (JP) ........................................ 2000-090188

(51) Int. Cl.[7] ................................................. G11C 7/00
(52) U.S. Cl. ............................ 365/230.03; 365/230.01; 365/63; 365/206; 365/205; 365/51
(58) Field of Search ........................ 365/230.01, 230.03, 365/51, 63, 205, 206

(56) References Cited

U.S. PATENT DOCUMENTS

| | | | | |
|---|---|---|---|---|
| 5,838,038 A | * | 11/1998 | Takashima et al. | 365/149 |
| 5,970,003 A | * | 10/1999 | Miyatake et al. | 365/200 |
| 6,088,252 A | * | 7/2000 | Fujisawa et al. | 365/51 |
| 2001/0000691 A1 | * | 5/2001 | Fujisawa et al. | 365/226 |
| 2001/0028593 A1 | * | 10/2001 | Sekiguchi et al. | 365/230.03 |
| 2001/0040835 A1 | * | 11/2001 | Fujisawa et al. | 365/226 |
| 2002/0001215 A1 | * | 1/2002 | Fujisawa et al. | 365/51 |

FOREIGN PATENT DOCUMENTS

| | | |
|---|---|---|
| JP | 4-6692 | 1/1992 |
| JP | 4-134691 | 5/1992 |
| JP | 9-213069 | 8/1997 |
| JP | 9-246482 | 9/1997 |

* cited by examiner

Primary Examiner—Viet Q. Nguyen
(74) Attorney, Agent, or Firm—Antonelli, Terry, Stout & Kraus, LLP

(57) ABSTRACT

A plurality of sense amplifier areas are placed alternately with respect to a plurality of memory array areas arranged along a first direction. The plurality of memory array areas are respectively provided with a plurality of bit lines provided along the first direction, a plurality of word lines provided along a second direction intersecting the first direction, and a plurality of memory cells provided in association with portions where the plurality of bit lines and the plurality of word lines intersect. Sense amplifiers are provided, each of which receives therein a pair of signals from each of the bit lines extending to one of the memory array areas on both sides adjacent to the respective sense amplifier areas and each of the bit lines extending to the other thereof. Respective word-line selecting timings or addresses with respect to the two memory array areas spaced away from each other with the two or more memory array areas interposed therebetween are independently set.

15 Claims, 24 Drawing Sheets

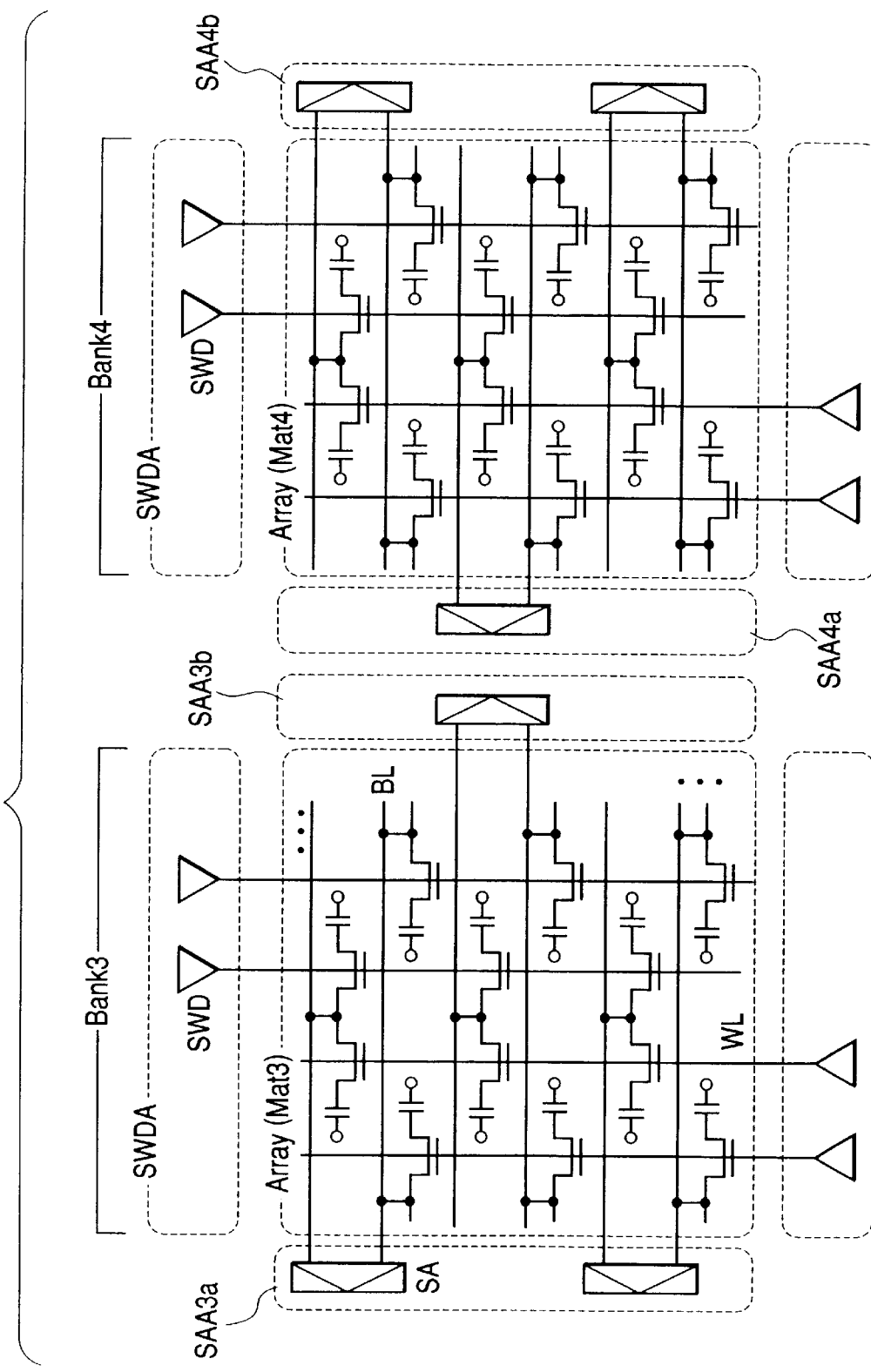

SEMICONDUCTOR MEMORY

BACKGROUND OF THE INVENTION

The present invention relates to a semiconductor memory, and principally to a technology effective for application to one of such a type that a so-called one-intersection type memory array having dynamic memory cells placed at intersecting points of word lines and bit lines is used and a large number of banks are provided therein.

According to investigations subsequent to the completion of the present invention, it has been revealed that Japanese Patent Application Laid-Open No. Hei 4(1992)-134691 (hereinafter called "prior art 1"), Japanese Patent Application Laid-Open No. Hei 2(1990)-289988 (hereinafter called "prior art 2"), Japanese Patent Application Laid-Open No. Hei 9(1997)-213069 (hereinafter called "prior art 3"), Japanese Patent Application Laid-Open No. Hei 4(1992)-6692 (hereinafter called "prior art 4") and Japanese Patent Application Laid-Open No. Hei 9(1997)-246482 (hereinafter called "prior art 5") have existed as those considered to be related to the present invention to be described later. The publications according to the prior arts 1 through 5 respectively disclose those in which information storage capacitors using MOS capacity are used and open bit-line type (one-intersection type or system) sense amplifiers are alternately disposed. However, these publications no disclose consideration paid to a multibank-configured DRAM related to the invention of the present application to be described later in either case.

SUMMARY OF THE INVENTION

It has been desirable to reduce the cost of a dynamic RAM (hereinafter called simply "DRAM"). To this end, a reduction in chip size is most effective. A scale-down has heretofore been pushed forward to reduce a memory cell size. It is however necessary to change even an operating mode or system of a memory array and thereby make a further reduction in cell size. By changing the operating mode of the memory array from a two-intersection type to a one-intersection type, the cell size can ideally be reduced to 75% by using the same design rule. However, the one-intersection type memory array has a problem in that array noise placed on each bit line or the like is high as compared with the two-intersection type memory array.

On the other hand, a multibank-configured DRAM array is of increasing importance in a Rambus DRAM and a logic-mixed DRAM to improve system performance. It has been revealed that when a one-intersection type multi-bank DRAM is configured, the one-intersection type memory array has the problem in that the array noise placed on the bit line or the like is high as compared with the two-intersection type memory array as described above, and noise interference between adjacent mats presents a large problem for the multi-bank configuration. In addition to the above, an increase in chip area due to end mats, which takes place where sense amplifiers are alternately laid out under a one-intersection configuration, also offers a problem, thus leading to the realization of the present invention under discussion of a method of solving these problems, which is intended for the multibank-configured DRAM.

An object of the present invention is to provide a semiconductor memory of a multi-bank configuration, which has implemented high integration thereof and the stabilization of its operation. Another object of the present invention is to provide a semiconductor memory while provides ease of use while achieving high integration thereof and the stabilization of its operation. The above, other objects and novel features of the present invention will become apparent from the description of the present specification and the accompanying drawings.

A summary of a typical one of the inventions disclosed in the present application will be described in brief as follows: A plurality of sense amplifier areas placed alternately with respect to a plurality of memory array areas placed along a first direction are provided. The plurality of memory array areas are respectively provided with a plurality of bit lines provided along the first direction, a plurality of word lines provided along a second direction intersecting the first direction, and a plurality of memory cells provided so as to correspond to portions where the plurality of bit lines and the plurality of word lines intersect. Sense amplifiers each of which receives therein a pair of signals from each of the bit lines extending to one of the memory array areas on both sides adjacent to the respective sense amplifier areas and each of the bit lines extending to the other thereof, are provided. Respective word-line selecting timings or addresses with respect to the two memory array areas away from each other with the two or more memory array areas interposed therebetween are independently set.

A summary of another typical one of the inventions disclosed in the present application will be explained in brief as follows: A plurality of sense amplifier areas placed alternately to a plurality of memory array areas placed along a first direction are provided. The plurality of memory array areas are respectively provided with a plurality of bit lines provided along the first direction, a plurality of word lines provided along a second direction intersecting the first direction, and a plurality of memory cells respectively provided in association with portions where the plurality of bit lines and the plurality of word lines intersect. Sense amplifiers each of which receives therein a pair of signals from each of the bit lines extending to one of the memory array areas on both sides adjacent to the respective sense amplifier areas and each of the bit lines extending to the other thereof, are provided. The two memory array areas provided adjacent to each other constitute one of a plurality of banks. Respective word-line selecting addresses with respect to two banks away from each other with one of the plurality of banks interposed therebetween are independently set.

BRIEF DESCRIPTION OF THE DRAWINGS

FIGS. 21A and 21B are respectively configurational diagrams of a two-intersection independent bank DRAM discussed prior to the present invention.

DETAILED DESCRIPTION OF THE INVENTION

Preferred embodiments of the present invention will hereinafter be described in detail with reference to the accompanying drawings.

Figure 1A:
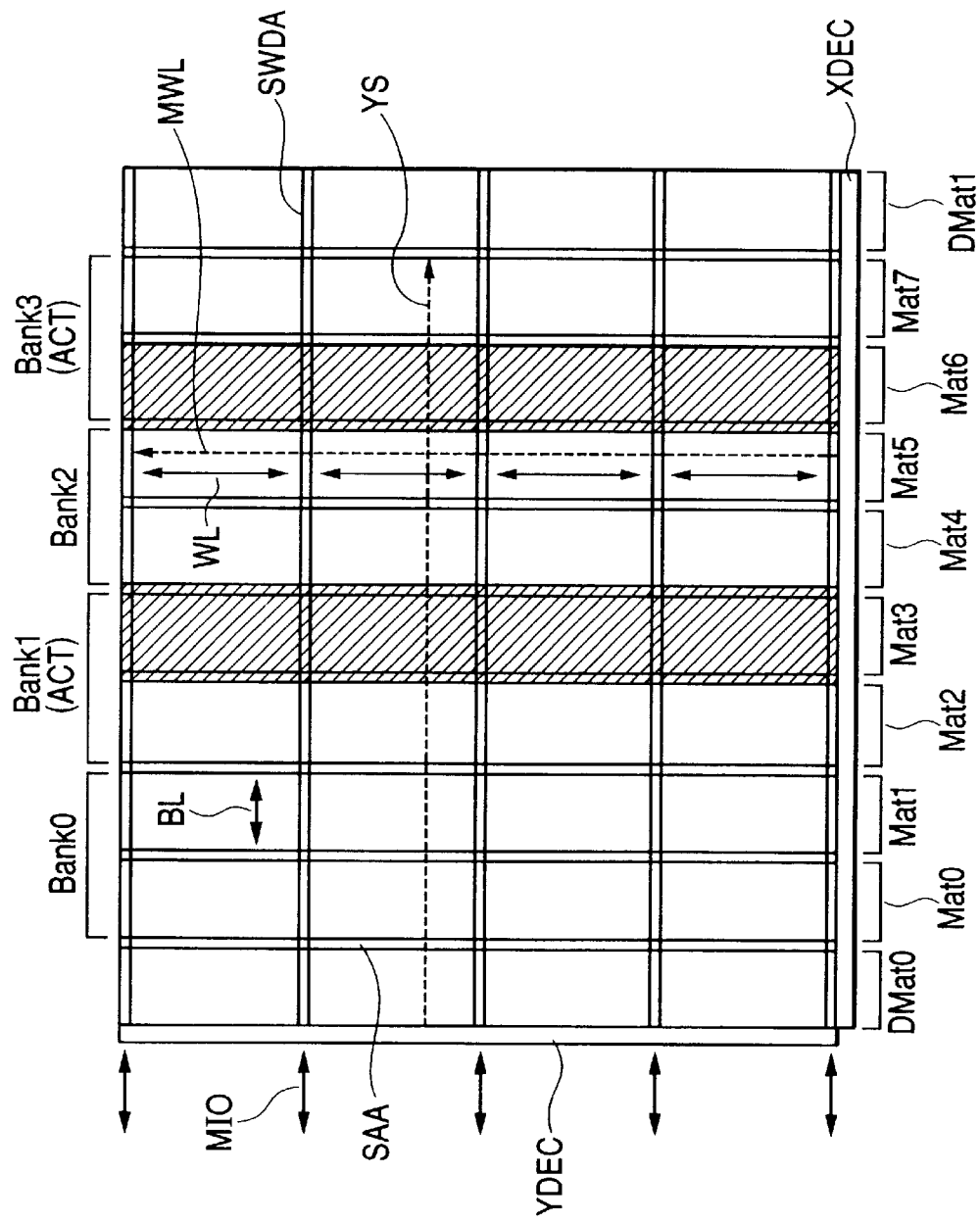
FIGS. 1A and 1B are respectively schematic configurational diagrams showing one embodiment of a DRAM according to the present invention.
Figure 1B:
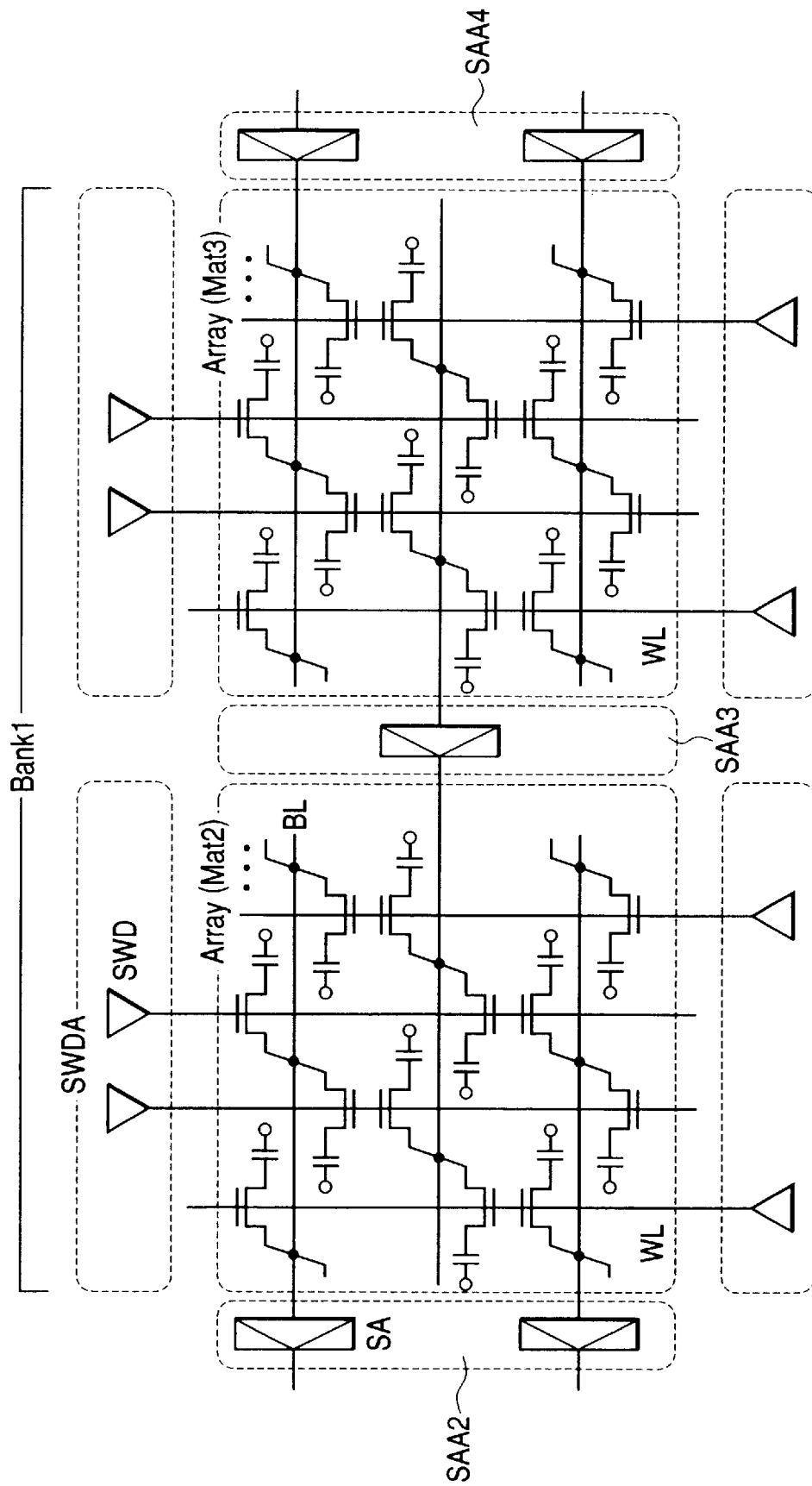

FIGS. 1A and 1B are respectively schematic configurational diagrams of one embodiment of a DRAM according to the present invention. FIG. 1A illustratively shows the layout indicative of the relationship between mats and banks. FIG. 1B illustratively shows mat configurations for one bank. In FIG. 1A, a row decoder XDEC and a column decoder YDEC are provided at their corresponding portions which adjoin a memory array. The row decoder XDEC forms or produces a signal for selecting each main word line MWL which extends so as to penetrate its corresponding memory array.

The row decoder XDEC is also provided with sub-word select line drivers for sub-word selection, each of which in turn extends in parallel to the main word line and transfers a signal for selecting a sub-word select line. The column decoder YDEC supplies a select signal to each column selector switch provided in a sense amplifier array SAA through a column select line YS extended so as to penetrate its corresponding memory array.

The memory array is divided into a plurality of arrays (Arrays) or mats (Mats). In the example illustrated in the same drawing, the memory array is divided into four as viewed in the direction of the main word line MWL and divided into ten as viewed in the direction of the column select line YS. The one array is formed so as to be surrounded by sense amplifier areas (or sense amplifier arrays) SAA and sub-word driver areas (or sub-word driver arrays) SWDA. Portions where the sense amplifier areas SAA and the sub-word driver areas SWDA intersect respectively, are called intersecting areas (cross areas).

Each sense amplifier provided for the sense amplifier area SAA comprises a latch circuit having a CMOS configuration and is defined as a so-called one intersection system which amplifies signals on complementary bit lines extended to both sides of each sense amplifier SA with the sense amplifier SA as the center. Although not restricted in particular, one array comprises 512 sub-word lines and ones (or data lines) of complementary bit lines orthogonal thereto, which are provided as 1024 lines. Accordingly, the one array referred to above is defined so as to have a storage capacity like about 512 Kbits.

In FIG. 1B, memory cells MCs each comprising a MOS transistor and a cell capacitor or capacitance are respectively connected to all points where bit lines BL and sub-word lines WL intersect. Each sense amplifier SA is connected to the bit lines, whereas sub-word drivers SWD are connected to the word lines WL. Memory cells are placed in array form within each array (Array) area surrounded by the corresponding sub-word drivers SWD and sense amplifiers SA.

The sense amplifiers SA are placed alternately with respect to the array area (Array). If attention is paid to bit lines BL lying within an illustratively-shown mat (Mat) 2, then the bit lines are alternatively connected to the right and left sense amplifiers SA. The present illustrative example shows the case in which the bit lines BL are connected to the right and left sense amplifiers SA on alternate lines. However, the bit lines BL may be connected to the right and left sense amplifiers SA at intervals of two lines.

Each of the main word lines MWL, which extend out form the row decoder (XDEC), is wired in the same direction as the word line WL and inputs a main word select signal to each sub-word driver array SWDA. Each of the column select lines YS, which extend out from the column decoder (YDEC), is wired in the same direction as the bit line BL and inputs a column select line signal to a column switch provided in each sense amplifier array SAA. In the present embodiment, an area surrounded by the corresponding sense amplifier SA and sub-word driver SWD will be called an "array (Array)" and a plurality of arrays arranged in the word line direction will be called "mats".

In the one-intersection array slave or dependent bank DRAM according to the present invention, the two mats contiguous in the above-described manner constitute one bank. For instance, a bank 1 comprises mats 2 and 3. The activation of each adjacent bank is prohibited until a certain bank is precharged after the same bank has been activated. Since the sense amplifiers are shared between the right and left banks in the boundary between the adjacent banks, a subordinate or dependent bank configuration is adopted. Further, dummy mats DMat0 and DMat1 provided with reference bit lines BL are placed on the outermost sides.

In FIG. 1A, four sub-word lines are arranged for each main word line in a bit-line direction to decrease the number of the main word lines, in other words, reduce the wiring pitch of each main word line although not restricted in particular. Each of sub-word selection drivers is provided in the row decoder XDEC to select one sub-word line from the sub-word lines divided into four in the main word-line direction and assigned in the bit-line direction four by four. This sub-word selection driver produces a signal for selecting one from the four sub-word select lines which extend in the direction of an arrangement of the sub-word drivers (sub-word driver arrays SWDA).

The sense amplifiers SA of a sense amplifier array SAA3 provided between the two arrays Array (Mat2 and Mat3) are connected to their corresponding pairs of bit lines such as to extend to both sides of the two arrays (Mat2 and Mat3). As to these sense amplifiers SA, one sense amplifier SA is arranged every two bit lines in the sense amplifier array SAA. Thus, the sense amplifier array SAA provided between the arrays (Mat2 and Mat3) is provided with 512 sense amplifiers SA corresponding to half of the 1024 bit lines where the 1024 bit lines exist as described above.

In the array (Mat2), the remaining 512 bit lines are connected to their corresponding sense amplifiers SA provided in a sense amplifier array SAA provided between the array (Mat2) and an unillustrated array (Mat1). In the array (Mat3), the remaining 512 bit lines are connected to their corresponding sense amplifiers SA provided in a sense amplifier array SAA provided between the array (Mat3) and an unillustrated array (Mat4). Since one sense amplifier may be formed every two bit lines according to the dispersed placement or layout of such sense amplifiers SA on both sides as viewed in the bit-line direction, the sub arrays and the sense amplifier arrays can be formed with high density so that the pitches of the sense amplifier SA and the bit line BL coincide with each other.

This is similar even to the sub-word drivers SWD. 512 sub-word lines WL provided in one array Array are divided 256 by 256, which in turn are connected to their corresponding 256 sub-word drivers SWD of the sub-word driver arrays SWDA placed on both sides of the array Array. In the present embodiment, the sub-word drivers SWD provided two by two are dispersively placed with two sub-word lines WL as each pair. That is, two sub-word drivers SWD are placed on the one-end side (on the upper side in the drawing) of the array Array with the sub-word lines as one pair, whereas two sub-word drivers SWD are placed on the other end side (on the lower side in the drawing) of the array Array with the similar two sub-word lines adjacent thereto as one pair.

Although not shown in the drawing, the sub-word drivers SWD form or produce signals for selecting sub-word lines for sub arrays provided on both sides with the sub-word driver array SWDA in which the sub-word drivers are formed, interposed therebetween. Thus, the sub-word drivers SWD can be dispersively placed with satisfactory efficiency in association with the sub-word lines each formed so as to coincide with an array pitch of each memory cell. The distance to each memory cell at a far end from the sub-word driver SWD becomes short, whereby the operation of selecting each memory cell by its corresponding sub-word line WL can be carried out at high speed.

In the array Array with the respective memory cells formed therein, although not restricted in particular, upper electrodes (plate electrodes) of storage capacitors are formed in common between all the memory cells MC in the arrays as plane electrodes. The supply of power to the plate electrodes is carried out at the boundary between the sub-word driver array SWDA and each of the arrays through a connecting portion from a power wire wired in the direction of extension of each bit line BL. The plate electrodes between the adjacent arrays are mutually connected with the same electrode material as the plate electrodes through the use of a clearance or gap defined between the sense amplifier arrays.

That is, the plate electrodes respectively formed in the arrays are connected to one another by wires using a plate layer itself. Further, the wires are provided in plural form so as to penetrate the sense amplifier arrays SAA, thereby greatly reducing resistance between the two plate electrodes. Thus, noise reversed in phase each other, which are developed in the plate electrodes when a small signal read from each memory cell MC selected between the mutual bit lines BL for the arrays is amplified by the corresponding sense amplifier SA, can be cancelled out at high speed, thereby making it possible to greatly reduce the noise produced in the plate electrodes.

Figure 2A:
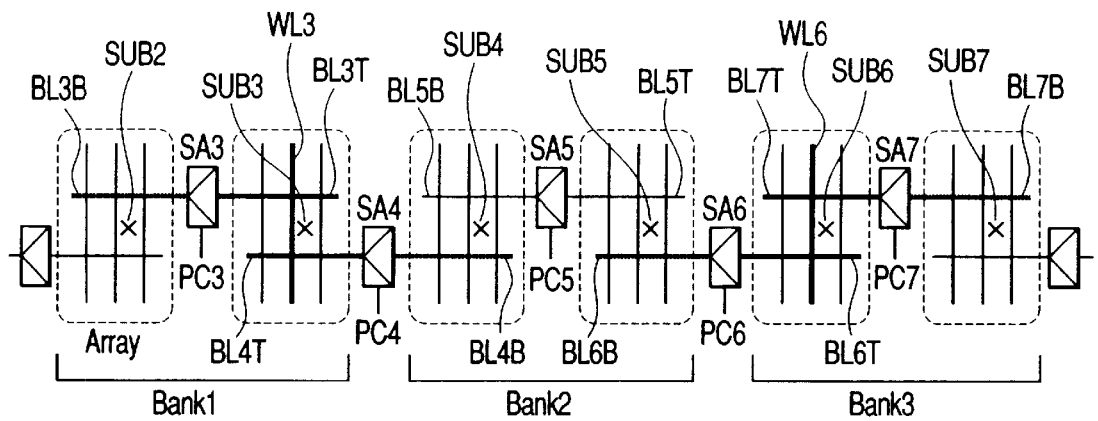
FIGS. 2A and 2B are respectively explanatory views showing one example of the operation of the DRAM according to the present invention.
Figure 2B:
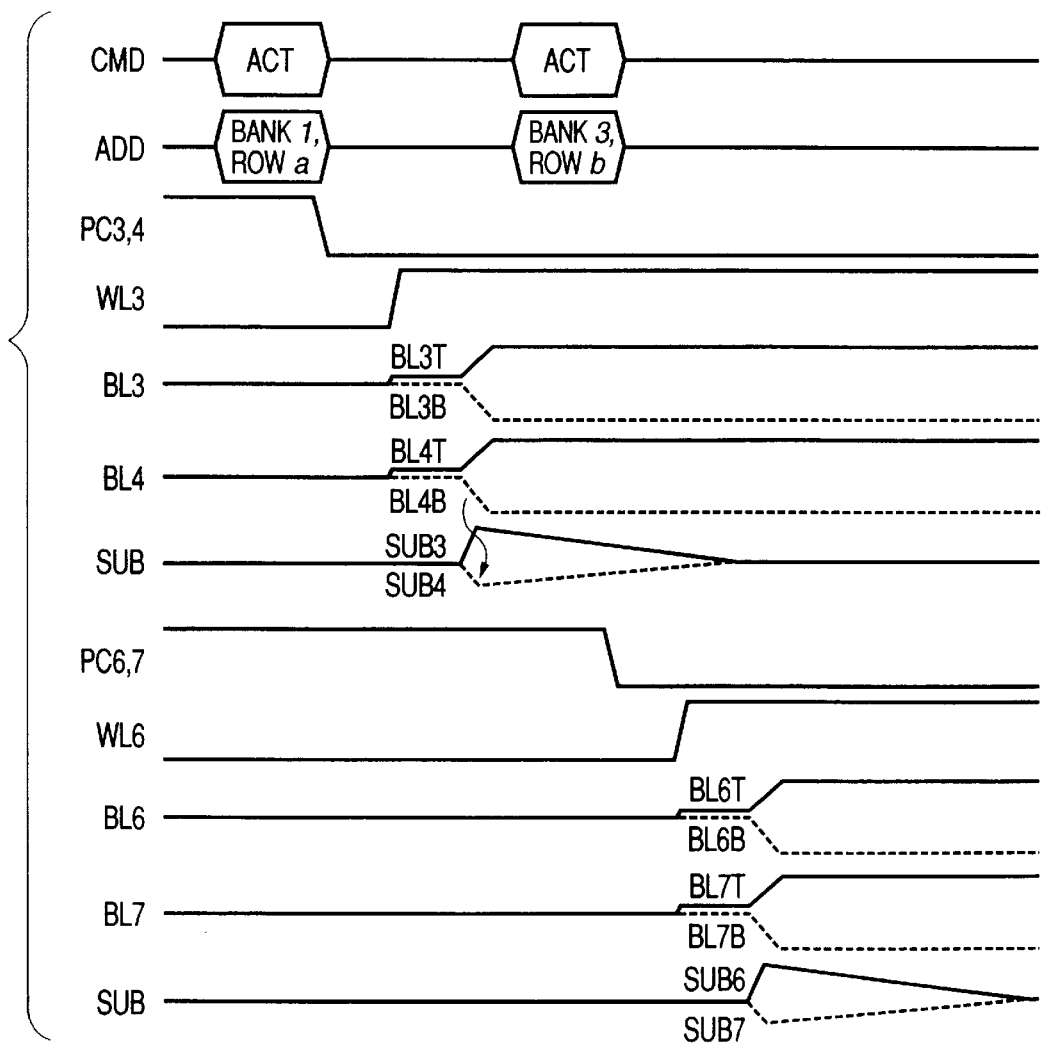

FIGS. 2A and 2B are respectively diagrams for describing one example of the operation of the DRAM according to the present invention. The same drawings show the operation of the DRAM at the time that two banks are activated continuously. In the present embodiment, the activation of adjacent banks is prohibited until the certain bank is precharged after the bank has been activated as described above. Thus, the present embodiment shows an example in which when a word line WL6 in the left mat of a bank 3 (Bank) is activated after a word line WL3 in the right mat of a bank (Bank) 1, for example, has bee activated, the closest mats are activated in succession.

A bit line BL4T of the right mat in the firstly-amplified bank 1 uses a bit line BL4B of the left mat in a bank 2 as a reference bit line BL. A bit line BL6T of the left mat in the subsequently-amplified bank 3 uses a bit line BL6B of the right mat in the bank 2 as a reference bit line BL. Since the bit line BL4B used for reference, of the left mat, which belongs to the bank 2, and the bit line BL6B used for reference, of the right mat, which belongs to the bank 2, exist in the mats different as viewed from side to side as described above, no noise is returned to the bit line BL6B even if noise is applied to a substrate SUB4 due to the amplification of the bit line BL4B.

Figure 9A:
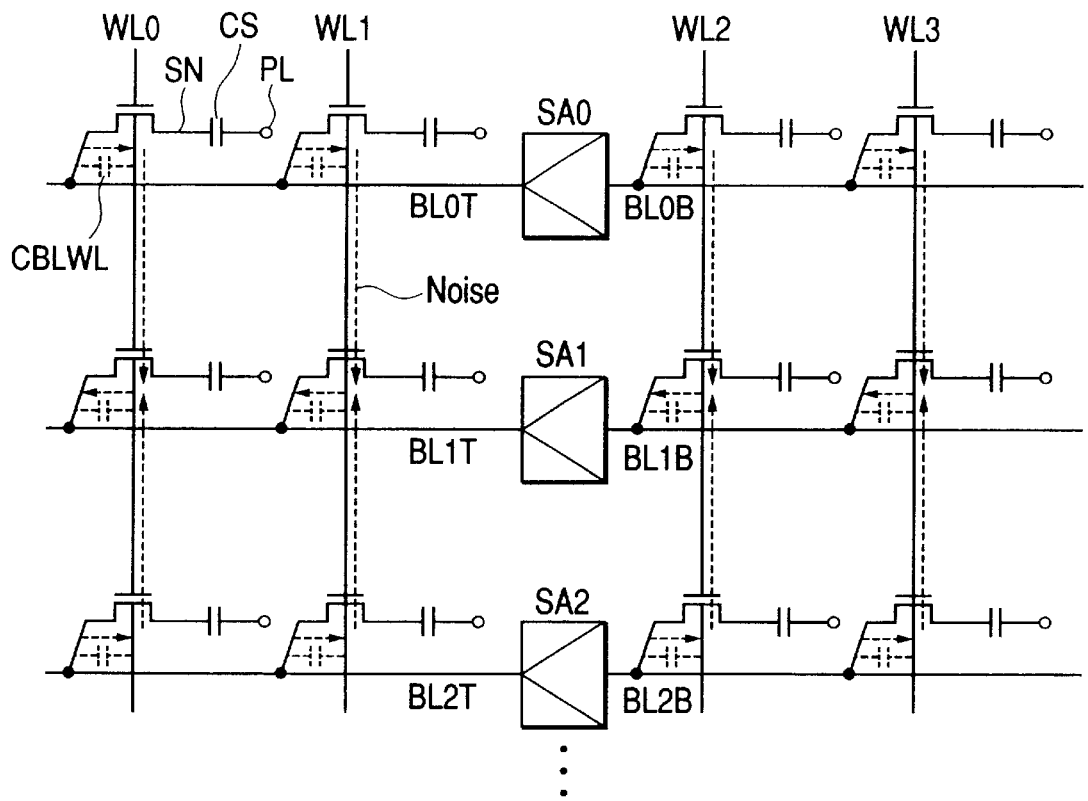
FIGS. 9A and 9B are respectively diagrams for describing the principle of generation of noise on each non-selected word line in a one-intersection array.
Figure 9B:
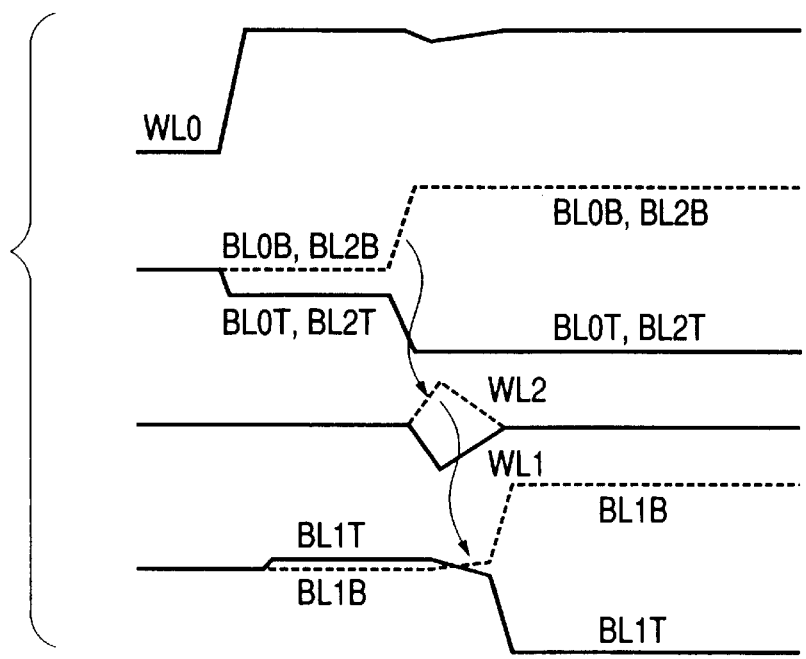

A description will now be made of the principle of generation of noise produced in the one-intersection array. A diagram for describing the principle of generation of noise produced in each non-selected word line is shown in FIGS. 9A and 9B. In the worst case of the one-intersection array in FIG. 9A, bit lines in a selected mat (in which each word line is selected) are all amplified to a low level (L) except for one bit line, and bit lines in a mat (in which each word line is non-selected and each bit line is used for reference) on the opposite side are all amplified to a high level (H) except for one bit line. At this time, there is a danger that only one bit line in the selected mat, on which a high-level (H) signal appears, is subjected to noise from each non-selected word line, whereby it would be amplified erroneously.

Now consider, as one example, where a word line WL0 on the left mat for the sense amplifiers SA is activated so that a high-level (H) signal appears on a bit line BL1T alone and a low-level (L) signal is read out onto other bit lines BL0T and BL2T and the like. When the high-level (H) signal developed on the bit line BL1T, based on the dispersion of an electrical charge from each memory cell is regarded as small due to the reason such as charge leakage or the like of the memory cell, if sense amplifiers SA0 through SA3 are activated, such bit line pairs BL0T/B, BL2T/B, etc. that signals greatly appear, are amplified fast in signal. On the other hand, a bit line pair BL1T/B small in signal is slow in amplification.

At this time, such noise Noise as to lower the potential applied to the bit line BL1T due to a parasitic capacitance CBLWL with respect to each of the bit lines BL0T and BL2T changed to the low level in unison is produced in a word line WL1 of the selected mat. To the contrary, such noise Noise as to lower the potential applied to a bit line BL1B by coupling developed due to the above parasitic capacitance from the bit lines BL0B and BL2B changed to the high level in unison is produced in a word line WL2 of the non-selected mat. Thus, when the difference between the potentials applied to the bit lines BL1T and BL1B, which are read out from the corresponding memory cells is reversed, the sense amplifier SA1 increases it, thereby leading to a malfunction.

Thus, the one-intersection type memory array referred to above gets into great danger that information is erroneously read when the amount of a signal charge stored in each memory cell decreases. This leads to degradation in refresh characteristic and can result in a great reduction in yield of the DRAM.

Figure 10A:
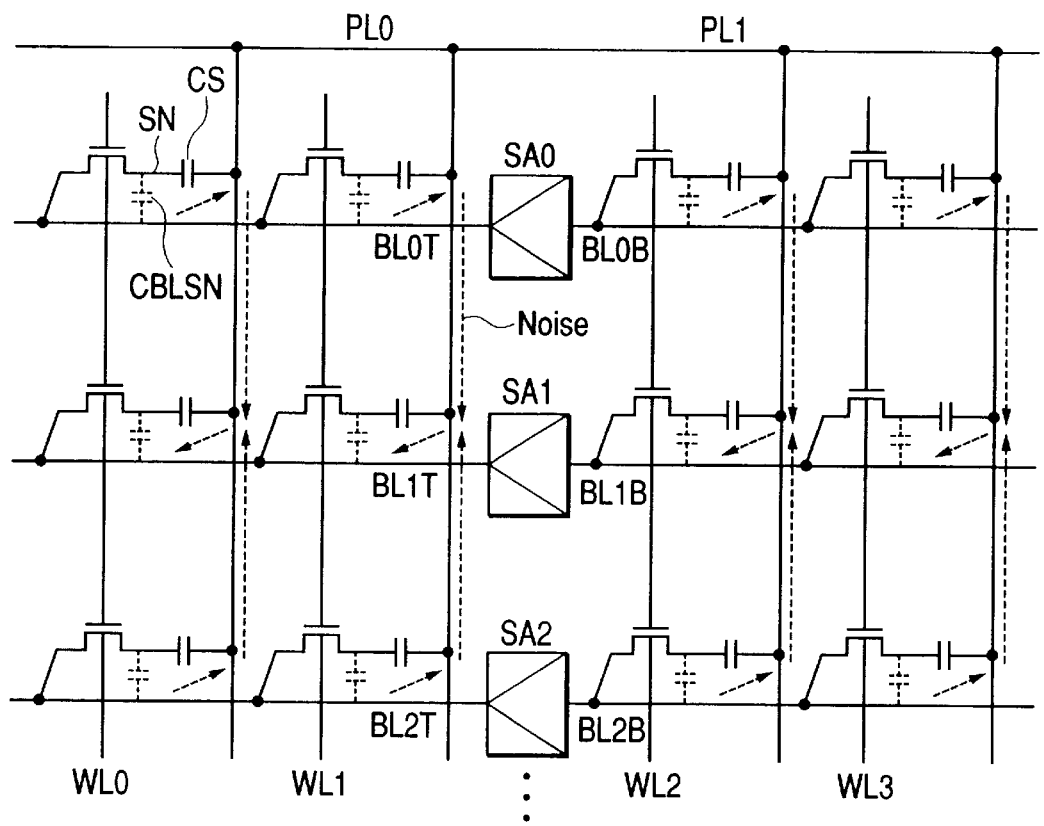
FIGS. 10A and 10B are respectively diagrams for describing the principle of generation of plate noise produced in a one-intersection array.
Figure 10B:
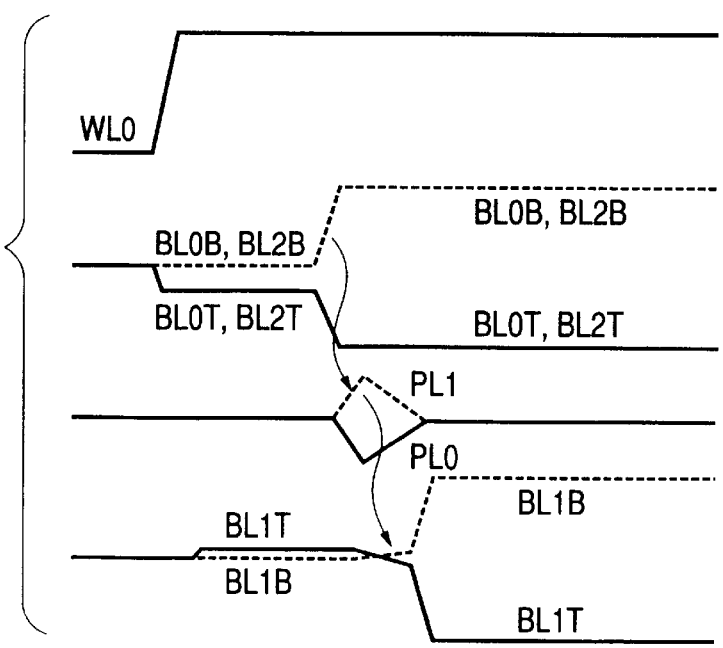
Figure 11A:
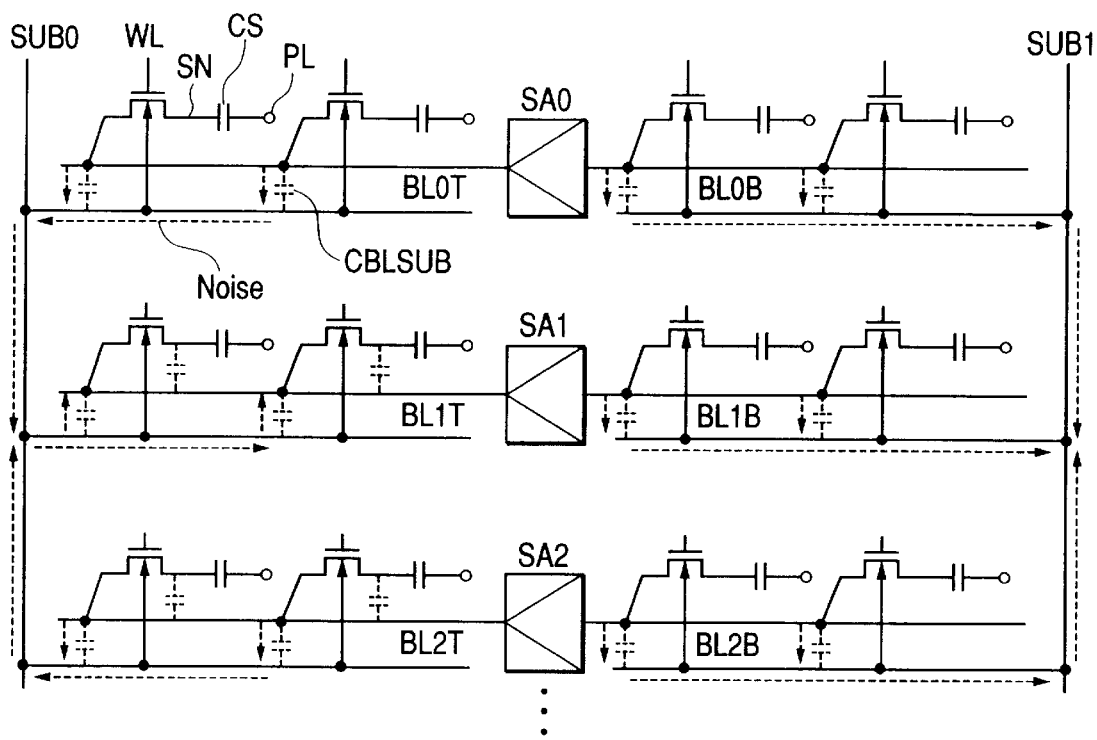
FIGS. 11A and 11B are respectively diagrams for describing the principle of generation of substrate noise produced in a one-intersection array.
Figure 11B:
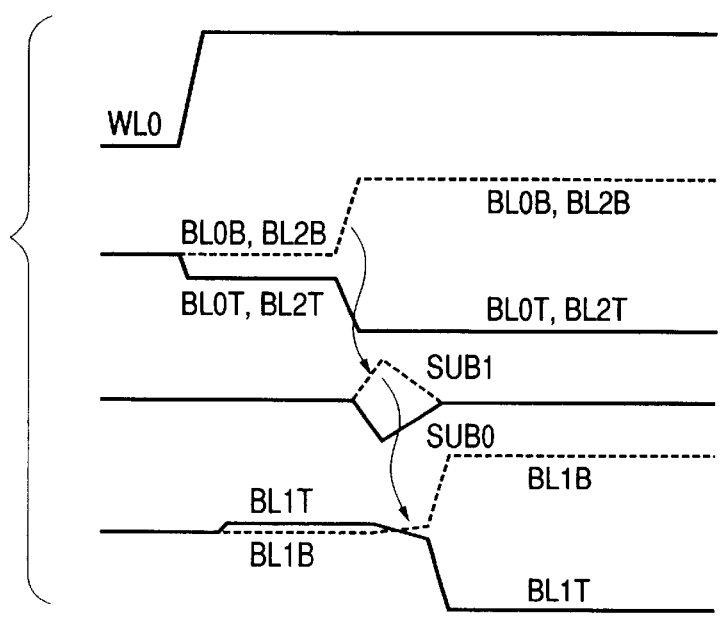

While the above description has been made with the noise developed in each non-selected word line as an example, noise having a similar mechanism is produced by coupling of each parasitic capacitance CBLSN with respect to a plate PL such as shown in FIGS. 10A and 10B and each parasitic capacitance CBLSUB with respect to such a substrate SUB as shown in FIGS. 11A and 11B. These noises reduce the amount of a signal on each bit line upon reading and degrade a read margin for the memory array.

Such a noise-producing mechanism is developed within the two memory mats with the sense amplifiers interposed therebetween. In such an embodiment as shown in FIGS. 1A and 2A, a sense amplifier SA5 of the bank 2 is not activated and bit lines provided in its corresponding two mats are used only as reference ones for sensing signals on selected bit lines in other banks 1 and 3. Accordingly, the above-described noise path offers no problem between the banks 1 and 3. Thus, the one-intersection array dependent bank DRAM according to the present invention causes no decrease in signal, scales up or enlarges a reading margin and enables a stable operation. In a manner similar even to the case in which the bank 3 is activated immediately after the bank 1 has been precharged, a reading margin is enlarged or scaled up because no noise is applied to the bit line BL6B of the bank 3 while not illustrated in FIGS. 2A and 2B.

Figure 3:
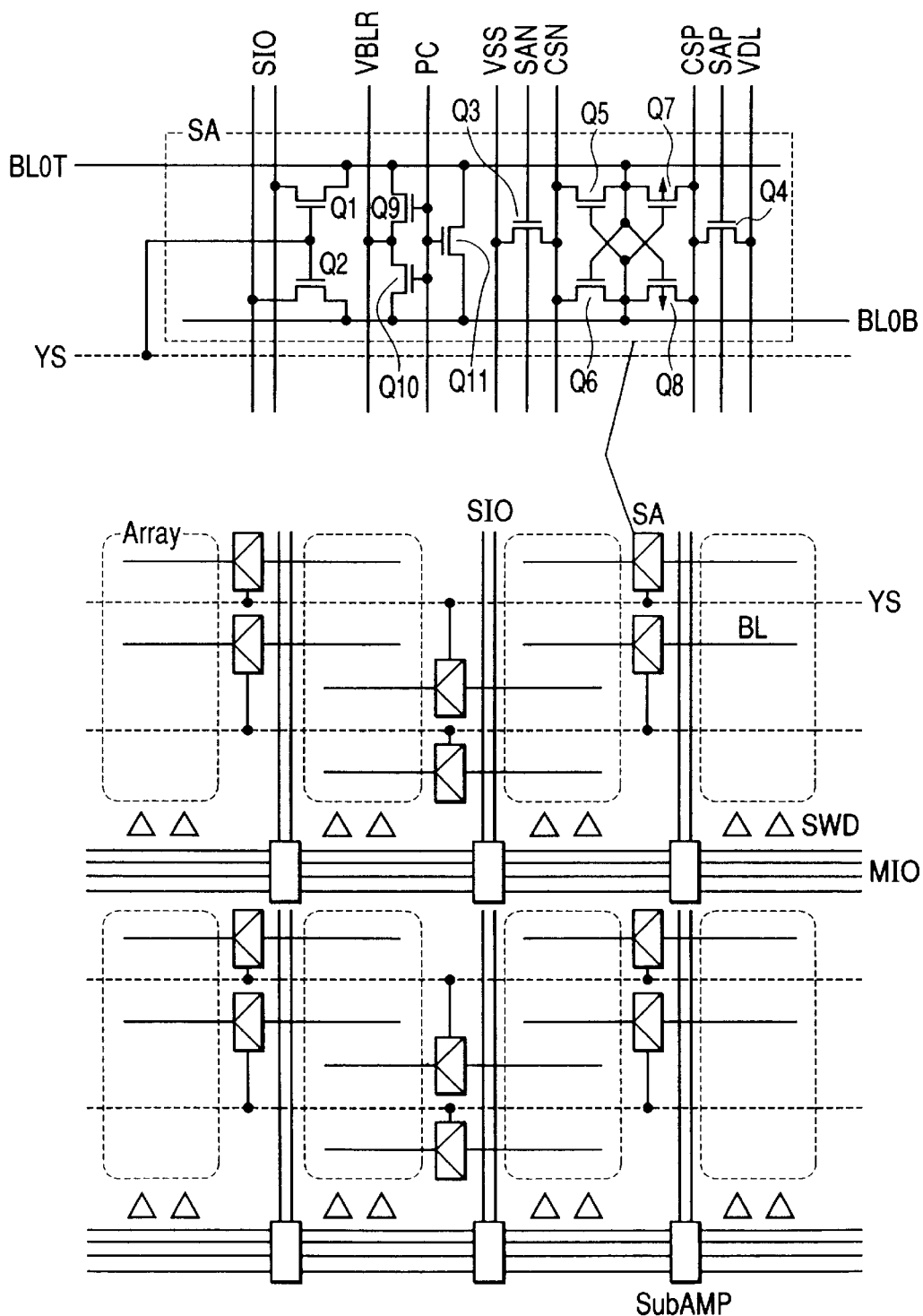
FIG. 3 is a block diagram for describing one embodiment illustrative of input/output paths of data employed in a one-intersection array dependent or subordinate bank DRAM according to the present invention.

FIG. 3 is a block diagram for describing one embodiment illustrative of input/output paths of data in the one-intersection array dependent bank DRAM according to the present invention. In the present embodiment, a plurality of bit lines provided in each array Array are provided for two sense amplifiers SA two by two and provided so as to be alternately distributed to the right and left sides of such an array Array. As the sense amplifier SA, one circuit is illustratively shown as typical.

A sense amplifier SA comprises a CMOS latch circuit comprising N channel amplifying MOSFETs Q5 and Q6 and P channel amplifying MOSFETs Q7 and Q8 whose gates and drains are respectively cross-connected and brought to latch form. The sources of the N channel MOSFETs Q5 and Q6 are electrically connected to a common source line CSN. The sources of the P channel MOSFETs Q7 and Q8 are electrically connected to a common source line CSP.

Power switches MOSFETs Q3 and Q4 are respectively electrically connected to the common source lines CSN and CSP. Although not restricted in particular, a ground potential supply line VSS is given or offered to the common source line CSN to which the sources of the N channel amplifying MOSFETs Q5 and Q6 are electrically connected, by or through the N channel power switch MOSFET Q3 dispersively laid out in such a sense amplifier area. The common source line CSP to which the sources of the P channel amplifying MOSFETs Q7 and Q8 are electrically connected, is provided with the N channel power MOSFET Q4 to supply an operating voltage VDL thereto.

The gates of the N channel power MOSFETs Q3 and Q4 are supplied with sense amplifier activation signals SAN and SAP. Although not restricted in particular, the high level of the SAP is defined as a signal having a boosted voltage VPP level. That is, the boosted voltage VPP is one boosted to greater than or equal to a threshold voltage of the MOSFET Q4 with respect to the source voltage VDL. This voltage VPP sufficiently brings the N channel MOSFET Q4 to an ON state, thereby making it possible to set the potential of the common source line CSP to the operating voltage VDL.

A precharge (equalize) circuit comprising an equalize MOSFET Q11 for short-circuiting complementary bit lines BL0T and BL0B, and switch MOSFETs Q9 and Q10 for respectively supplying a half precharge voltage VBLR to the complementary bit lines BL0T and BL0B is provided at input/output nodes of the sense amplifier SA. The gates of these MOSFETs Q9 through Q11 are supplied with a precharge (bit-line equalize) signal PC in common. As to a driver circuit for forming or producing the precharge signal BLEQ, although not shown in the drawing, an inverter circuit is provided in each cross area shown in FIG. 2 to make the rising edge and falling edge of the precharge signal fast. That is, the driver circuit is one which performs, at high speed, switching between the MOSFETs Q9 through Q11 constituting the precharge circuit through the inverter circuits dispersively provided in each individual cross areas, prior to word-line selecting timing upon commencement of a bank access.

The pair of input/output nodes of the sense amplifier SA is electrically connected to local (sub) input/output lines SIO extended along a sense amplifier array through a column (Y) switch circuit comprising MOSFETs Q2 and Q3 as well as to the complementary bit lines BL0T and BL0T. The gates of the MOSFETs Q1 and Q2 are electrically connected to a column select line YS. When the present column select line YS is brought to a selection level (high level), they are turned ON to electrically connect the input/output nodes of the sense amplifier SA and the local input/output lines SIO to one another.

Thus, the input/output nodes of the sense amplifier SA amplify a small voltage change with respect to a half precharge voltage on each bit line, which changes according to an electrical charge stored in each memory cell electrically connected to a point intersecting a word line of an array selected from two arrays provided with the input/output nodes interposed therebetween while a half precharge voltage on each bit line on the non-selected array side is being used as a reference voltage. One selected by the column select line YS is transferred to the local input/output lines SIO through the column switch circuit (Q1 and Q2).

The local input/output lines SIO extend over the sense amplifier arrays aligned along the extension direction of the main word lines. Signals amplified through sub amplifier circuits (SubAMP) are transferred to main amplifiers provided in column decoders through main input/output lines MIO each extended in the direction orthogonal thereto, i.e., in the column select-line YS direction. The signals are outputted in parallel in plural-bit units according to the number of divisions of the array. Such an input/output line configuration is a system suited when data read out from one mat is about 4 bits and YS is large in number. A simple switch other than the sub amplifier may connect between the SIO and MIO.

Figure 4:
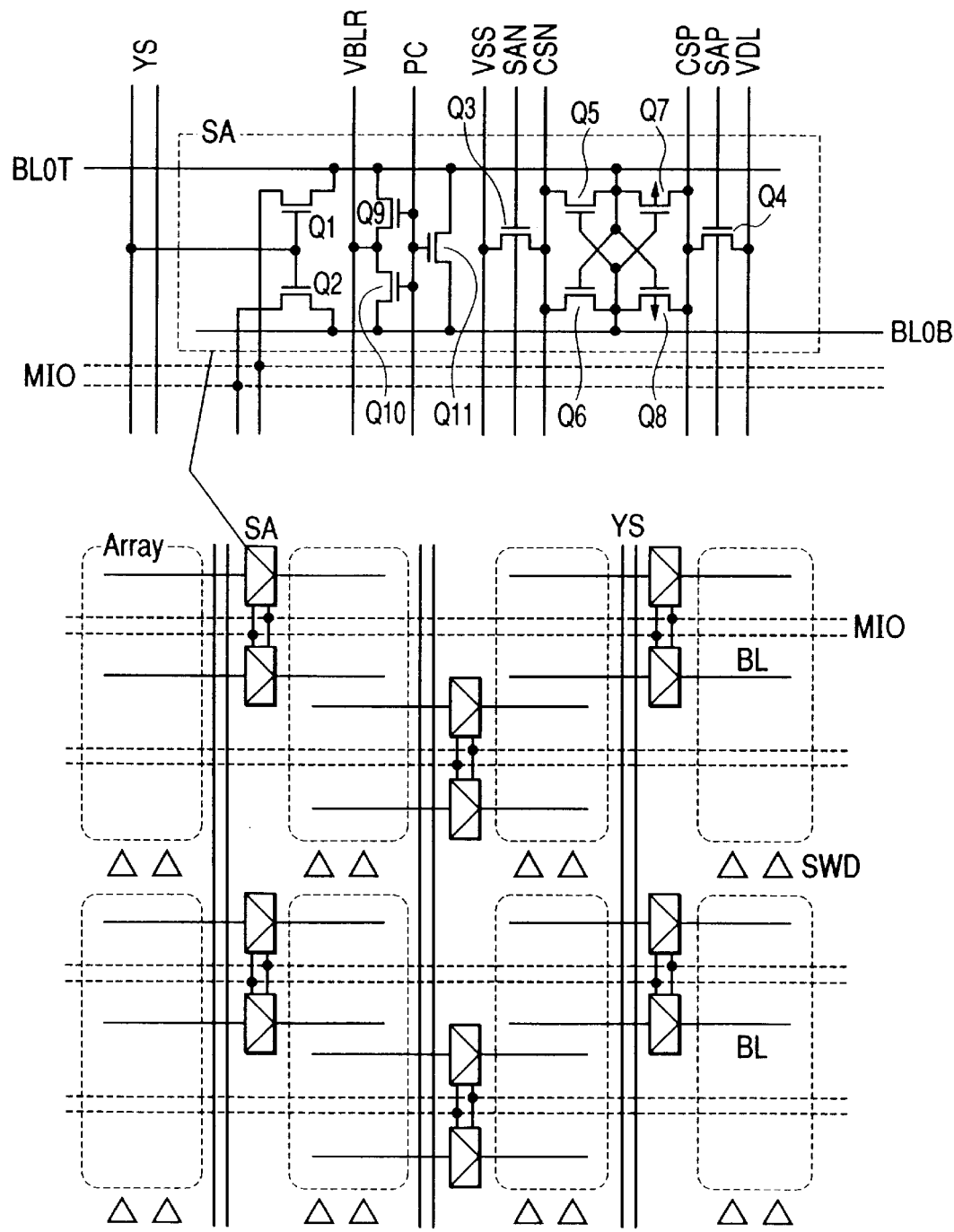
FIG. 4 is a block diagram for describing another embodiment illustrative of the input/output paths of the data employed in the one-intersection array dependent bank DRAM according to the present invention.

FIG. 4 is a block diagram for describing another embodiment illustrative of input/output paths of data in the one-intersection array dependent bank DRAM according to the present invention. In the present embodiment, column select lines YS are wired in a word-line direction, and data stored in each sense amplifier SA is directly read out to main input/output lines MIO wires in a bit-line direction. This is a circuit configuration applied to the case in which the main input/output lines MIO are large in number and multi-bit data of, for example, about 128 bits are read out to the main input/output lines MIO at a time.

Figure 5:
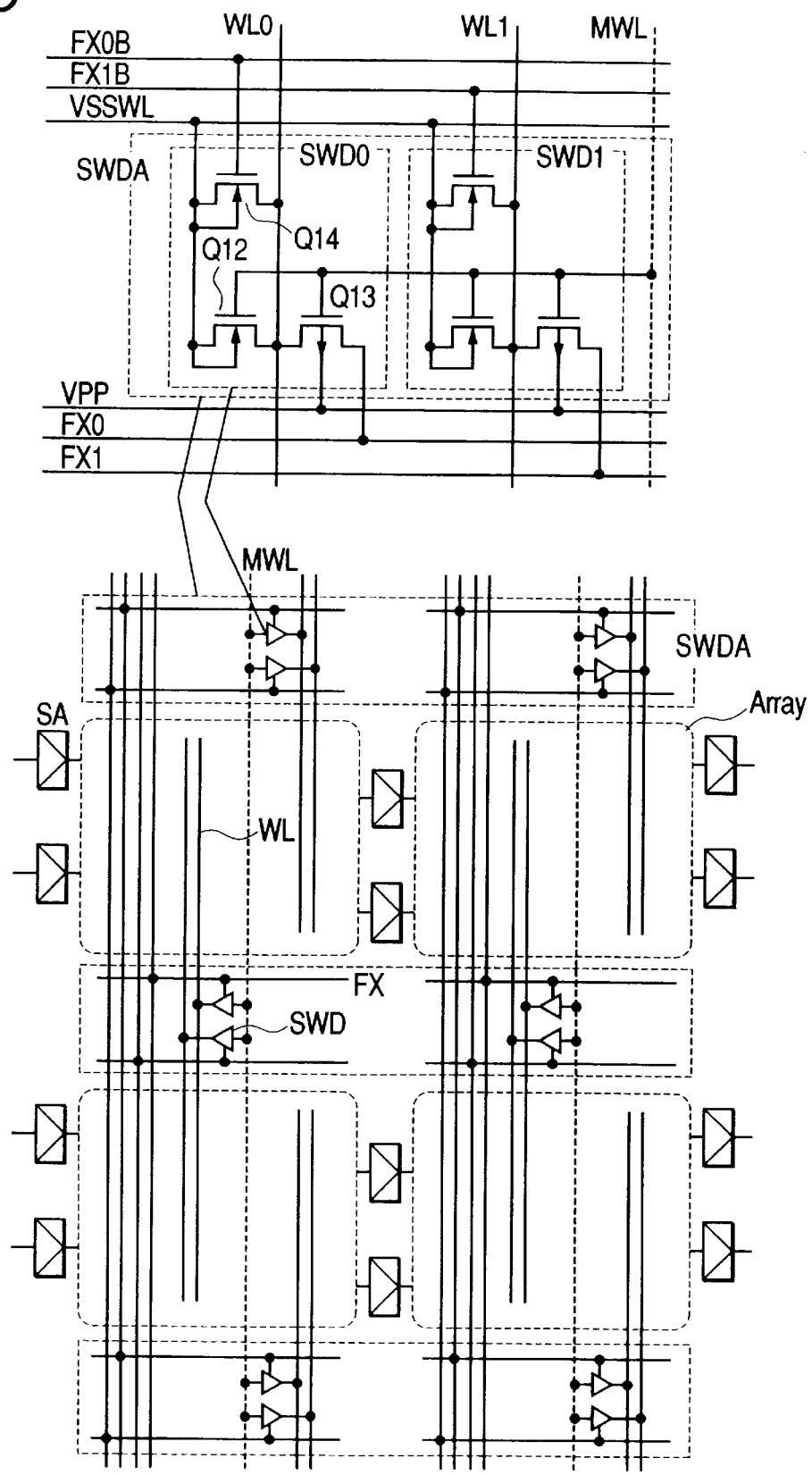
FIG. 5 is a block diagram for describing one embodiment of a circuit for selecting each of word lines employed in the one-intersection array dependent bank DRAM according to the present invention.

FIG. 5 is a block diagram for describing one embodiment of a circuit for selecting each word line employed in the one-intersection array dependent bank DRAM according to the present invention. In the present embodiment, a plurality of word lines provided in each array Array are provided for two sub-word drivers two by two and provided so as to be alternately divided in upward and downward directions of the array Array. The two circuits SWD0 and SWD1 are illustratively shown as typical as the sub-word drivers SWD.

One sub-word driver SWDO comprises a CMOS inverter circuit comprising an N channel MOSFET Q12 and a P channel MOSFET Q13, and an N channel MOSFET Q14 provided in parallel to the N channel MOSFET Q12. The sources of the N channel MOSFETs Q12 and 14 are respectively electrically connected to a power supply line VSSWL corresponding to a non-selection level VSS (OV) of a sub-word line. A power supply line VPP for supplying a boosted voltage is provided in an N well region (substrate) in which the P channel MOSFET Q13 is formed.

The gates of the MOSFETs Q12 and Q13 constituting the CMOS inverter circuit of the sub-word driver SWDO are electrically connected to their corresponding main word line MWL in common with the gates of similar MOSFETs in the remaining sub-word driver. The source of the P channel MOSFET Q13 constituting the CMOS inverter circuit is electrically connected to its corresponding sub-word selection line FX0. The sub-word selection line FX0B is provided for the gate of the MOSFET Q14 provided in the sub-word driver SWD0. The sub-word selection lines FX1 and FX1B are respectively electrically connected to the remaining sub-word driver SWD1.

When a sub-word line WL0 is selected, the main word line MWL is brought to a low level. Further, the sub-word selection line FX0 corresponding to the sub-word line WL0 is brought to a high level like a boosted voltage VPP. Thus, the P channel MOSFET Q13 of the sub-word driver SWD0 is turned on to transfer the selection level VPP on the sub-word selection line FX0 to the sub-word line WL0. At this time, the MOSFET Q14 is kept in an off state in response to a low level of the sub-word selection line FX0B in the sub-word driver SWD0.

In another sub-word driver SWD1 in which the main word line MWL is brought to a selected state of a low level, the P channel MOSFET is turned on. However, the N channel MOSFETs are turned on according to a high level of the sub-word selection line FX1B to bring the sub-word line WL1 to the non-selection level VSS. In the non-selected sub-word driver in which the main word line MWL is brought to the high level, the N channel MOSFETs of the CMOS inverter circuit are turned on by the high level of the main word line MWL to thereby bring each individual sub-word lines to the non-selection level VSS.

Since the pair of sub-word lines corresponding to the two arrays is selected by the three MOSFETs in this way, sub-word drivers can be formed so as to coincide with the pitches of the sub-word lines WL provided in the array (mat) of the one-intersection system and placed in high concentrations. Sub-word drivers can be laid out which are adapted to one-intersection system capable of ideally reducing each cell size to 75% by using the same design rule as one for a two-intersection system.

When the sub-word drivers are dispersively laid out on both sides of each array according to two-by-two combinations every two sub-word lines WL as described above, the P channel MOSFETs constituting the two sub-word drivers can be formed in the same N type well region, and the N channel MOSFETs can be formed in the same P type well region. As a result, the sub-word drivers can be brought into high integration. This is similar even to the above-described sense amplifiers, which are dispersively placed on both sides of each array according to two-by-two combinations every two bit lines BL.

Figure 6A:
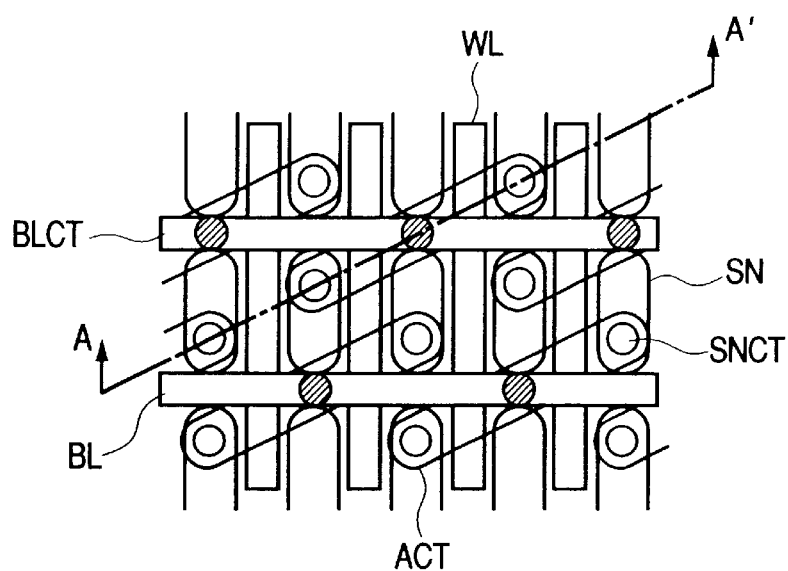
FIGS. 6A and 6B are respectively diagrams showing a structure of a memory cell employed in a one-intersection array DRAM according to the present invention.
Figure 6B:
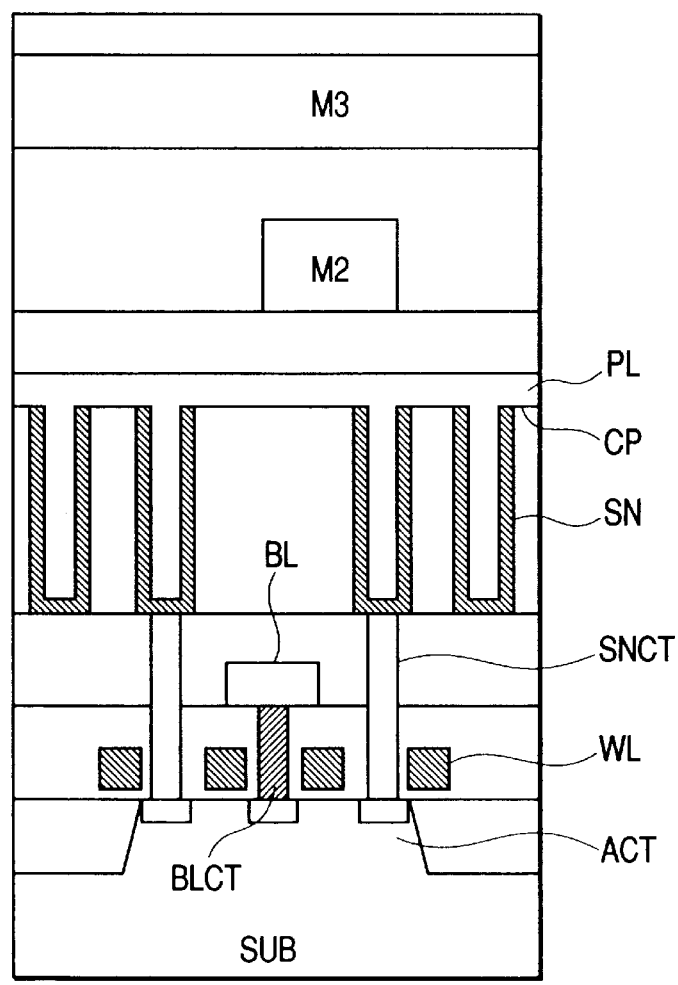

FIGS. 6A and 6B respectively show a structure of a memory cell employed in a one-intersection array DRAM according to the present invention. A cross-sectional view taken along line A–A' of a layout shown in FIG. 6A is shown in FIG. 6B. In the one-intersection array, memory cells each comprising a MOS transistor and a cell capacitor or capacitance are connected to all points where bit lines BL and word lines WL intersect respectively. ACT indicates an active region of each MOS transistor, SN indicates a lower electrode of each cell capacitance, SNCT indicates a contact for connecting SN and ACT to each other, BLCT indicates a contact for connecting BL and ACT to each other, and CP indicates a capacitive insulating film, respectively. An upper electrode plate PL of each cell capacitance is common-connected to all the memory cells lying within each mat and placed in flat form. A substrate SUB for each MOS transistor is also connected in common within the mat similarly. Metal wirings M2 and M3 corresponding to two layers are wired over the plate. The present example shows a case in which M2 is wired in a word-line direction and used for a main word line (MWL), and M3 is wired in a bit-line direction and used for a column select line (YS).

The memory cell makes use of a COB (Capacitor over Bitline) structure. That is, the storage nodes SN are provided over the bit lines BL. Thus, since the plate electrodes PL can be formed in one flat form without being cut by the bit lines BL and the connecting portions BLCT of the address selection MOSFETs within the arrays, the resistance of each plate electrode PL can be reduced. Since the bit line BL exists on the plate electrode PL when a CUB (Capacitor under Bitline) structure is adopted contrary to the present embodiment. In this structure, it is necessary to define holes in the plate electrode PL within each array and bring such connecting portions BLCT to the active regions ACT for purpose of connecting each bit line BL and the source and drain of each address selection MOSFET.

The plate electrode PL takes a laminated structure using PL(D) and PL(U), and the sheet resistance value of such a plate electrode PL may be lowered. Now consider where a high dielectric film such as BST or $Ta_2O_5$ is used for the capacitive insulating film CP of the storage capacitor as one example. When Ru is used for the lower electrode (storage node) SN and upper-electrode lower layer PL(D) in this case, the capacity of each storage capacitor CS can be increased. Since Ru is low in sheet resistance value as compared with the conventionally used poly Si, the resistance value of each plate electrode PL can be reduced.

Further, if W is stacked on this structure as the plate electrode PL(U), then the resistance value of the plate electrode PL can further be reduced. When the resistance value of the plate electrode PL itself is reduced in this way, the speed of canceling out noise lying on the plate electrodes PL is made fast and hence the noise developed in the plate electrodes PL can be reduced. Further, TiN may be used as the plate electrode PL(D). Even in this case, an advantageous effect similar to the above can be obtained.

In the above-described structure of memory cell as is apparent from FIG. 6A, the connecting portions SNCT for connecting the storage nodes SN and the source and drain diffusion layers of MOSFETs are provided adjacent to each of the bit lines BL. That is, the parasitic capacity or capacitance exists between the storage node of the memory cell and the bit line BL as viewed in the vertical direction of a cross-section of the structure. Since the parasitic capacity constitutes the parasitic capacitance CBLSN shown in FIG. 10, this leads to a beneficial one in that such plate electrodes as employed in the present invention are interconnected by wirings using themselves, the adjacent two mats constitute one bank as described above, and the activation of each adjacent bank is prohibited until a certain bank is precharged after the bank has been activated.

Figure 7:
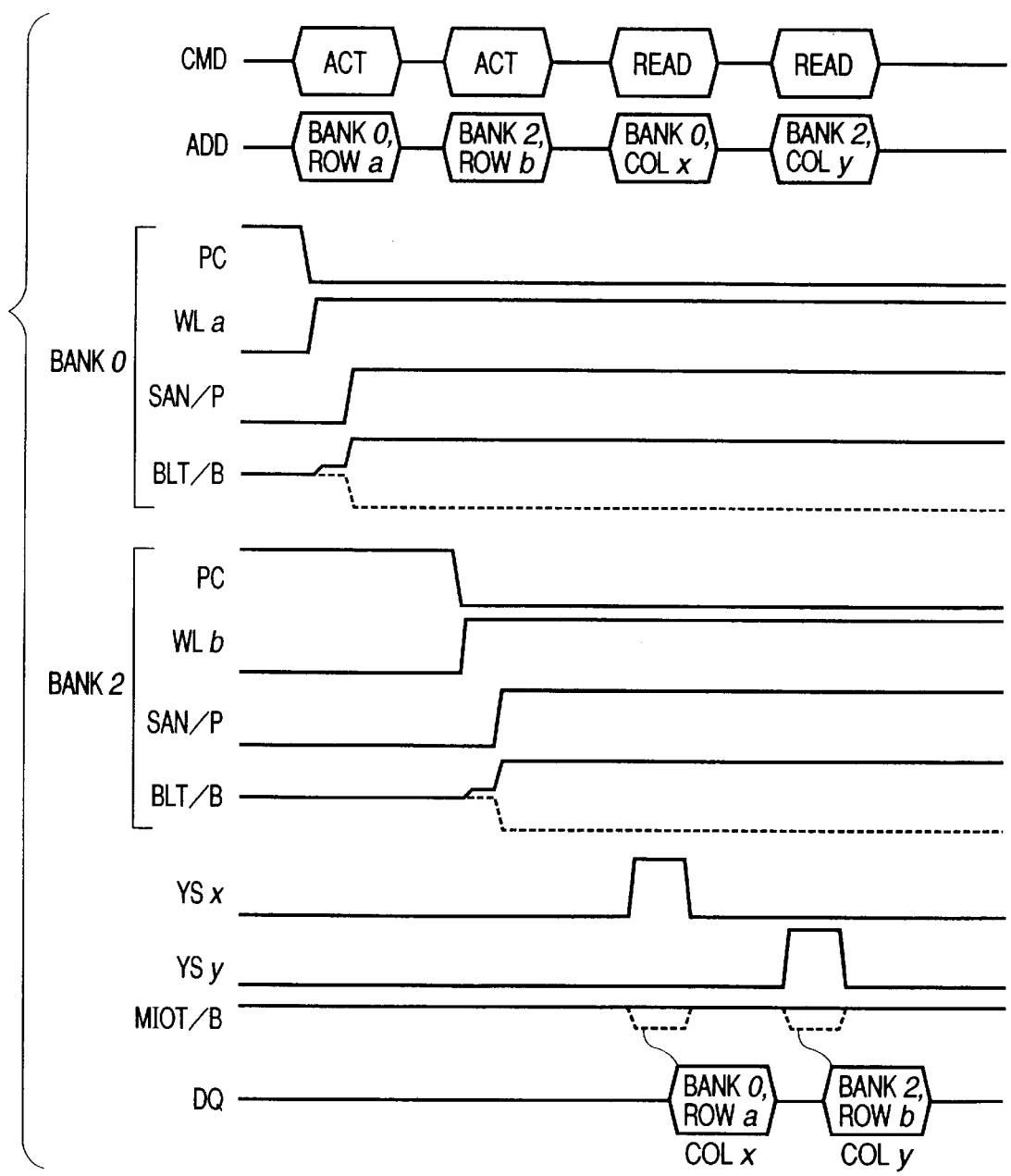
FIG. 7 is a waveform diagram for describing one example of the operation of the one-intersection array dependent bank DRAM according to the present invention.

FIG. 7 is a waveform chart for describing one example of the operation of the one-intersection array dependent bank DRAM according to the present invention. A bank address with respect to a bank (Bank) 0 and a row address with respect row (ROW) a are inputted from an address ADD terminal and an activation command ACT is inputted. At the bank 0, a precharge signal PC is deactivated so that the precharge of a bit line BL is completed and a word line WLa is activated. After a small signal from a memory cell is produced in a bit line BLT/B, a sense amplifier start signal SAN/P is activated to start the amplification of a sense amplifier SA. In this condition, information on the word line WLa is held in the sense amplifier SA at the bank 0.

In a multi-bank DRAM, a bank 2 can also be activated in a state in which the information is held in the bank 0. In a manner similar to the previous operation, a bank address with respect to the bank (Bank) 2 and a row address with respect to a row (ROW) b are inputted from the address ADD terminal. When an activation command ACT is inputted, its corresponding word line and sense amplifier are activated so that information on the word line WLb is held in its corresponding sense amplifier of the Bank 2.

The data stored in the sense amplifiers SA of the banks 0 and 2 can be read out from this state in a short period of time. That is, when a read command READ is inputted with respect to the bank (Bank) 0 and a column (COL)x, YSx is activated so that data in the bank (Bank) 0, row a and column x are read out from the sense amplifier SA of the bank 0 to an input/output terminal DQ through a main input/output line MIOT/B. Similarly, when a read command READ is inputted with respect to the bank (Bank) 2 and a column (COL)y, YSy is activated so that data in the bank (Bank) 2, row b and column y are read from the sense amplifier SA of the bank 2 to the input/output terminal DQ through a main input/output line MIO. In a DRAM having a multi-bank configuration, a plurality of banks are kept active as described above to thereby allow high-speed reading similar to such a static RAM that sense amplifiers are set as storage or memory circuits (memory cells).

Figure 8:
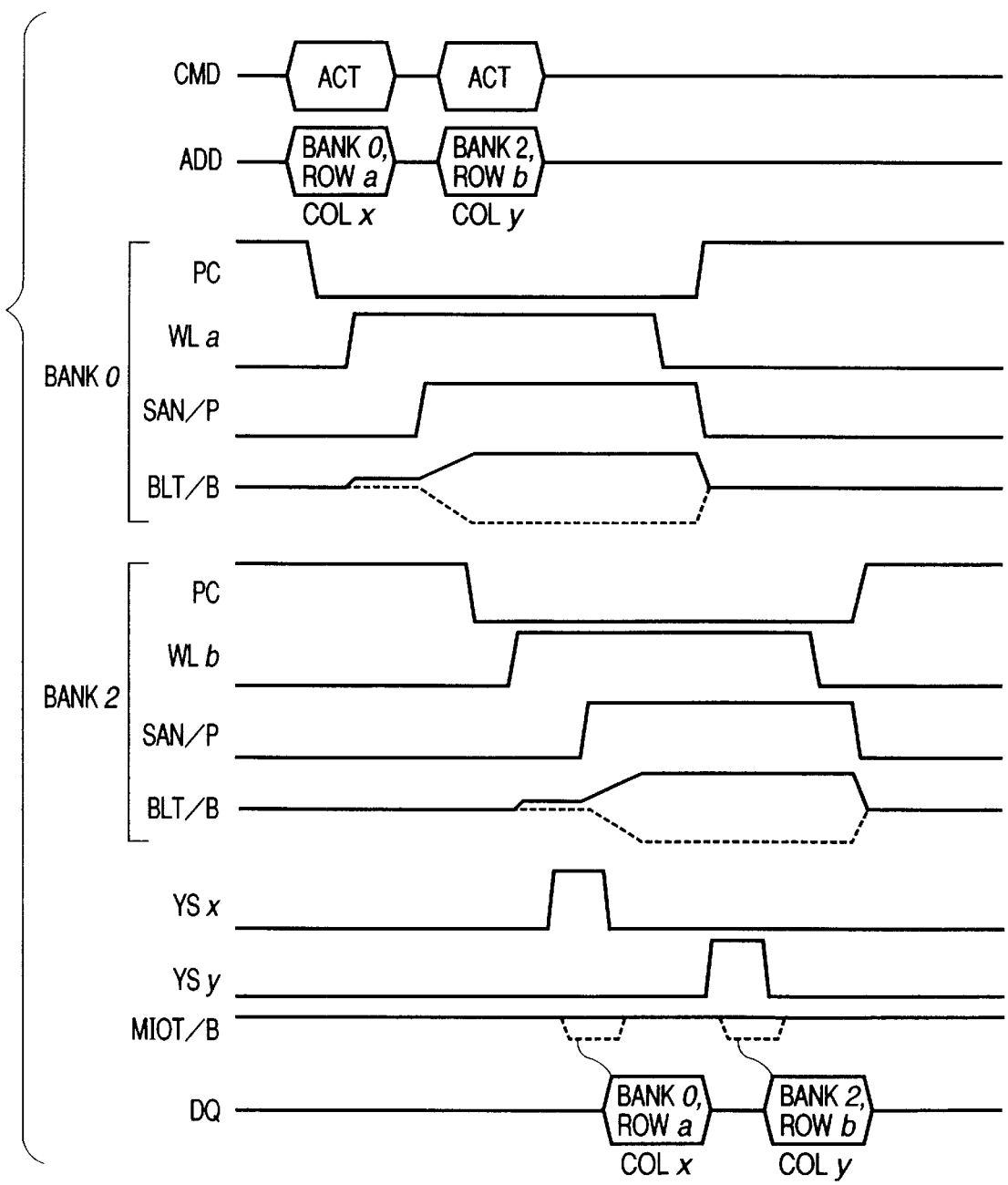
FIG. 8 is a waveform diagram for describing another example of the operation of the one-intersection array dependent bank DRAM according to the present invention.

FIG. 8 is a waveform chart for describing another example of the operation of the one-intersection array dependent bank DRAM according to the present invention. FIG. 7 shows the case in which the row address and column address are inputted in separate times. However, they may be inputted simultaneously. That is, when a first ACT command is inputted as shown in the same drawing, a bank address with respect to a bank (Bank) 0, a row address with respect to a row (ROW) a, and a column address COLx are inputted from an address ADD terminal. Upon the input of the next ACT command, a bank address with respect to a bank (Bank) 2, a row address with respect to a row (ROW) b, and a column address COLy are inputted from the address ADD terminal. Output data are respectively read out based on the one command.

In the present embodiment, the corresponding bit line of the bank 0 is precharged immediately after the data stored in the bank (Bank) 0 is outputted from a data terminal DQ. This can provide a quick access because the precharge is completed to thereby allow the selection of a word line corresponding to another row address where row addresses other than a are sequentially inputted to the bank 0. Since the present embodiment takes the multi-bank configuration in a manner similar to the previous one, data can simultaneously be held in sense amplifiers at the banks 0 and 2.

Figure 12:
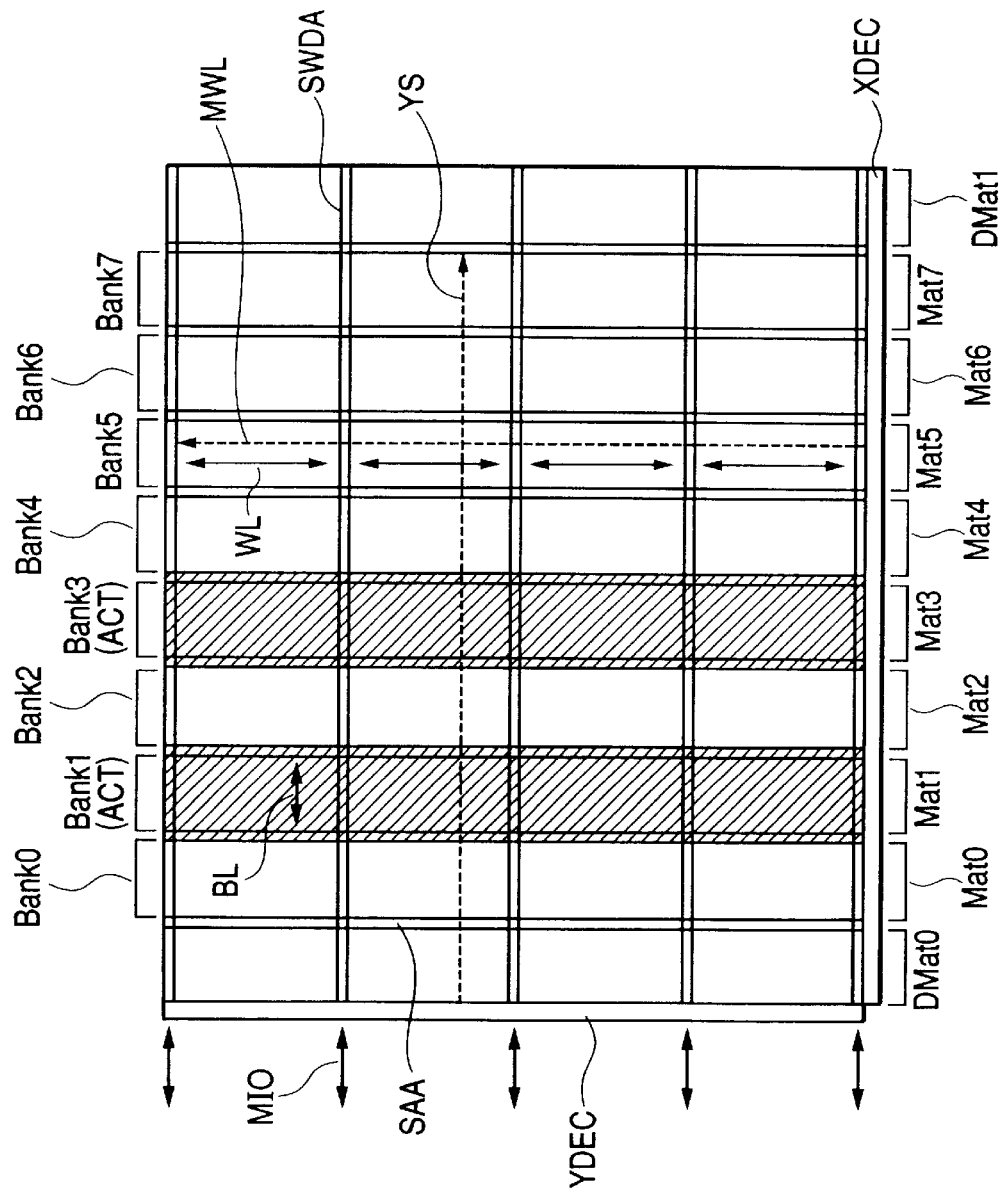
FIG. 12 is a memory array configurational diagram showing another embodiment of a one-intersection array dependent bank DRAM according to the present invention.

FIG. 12 is a memory array configurational diagram of another embodiment of a one-intersection array dependent bank DRAM according to the present invention. The present embodiment is different from the embodiment shown in FIGS. 1A and 1B only in that one mat is assigned to one bank. Even in this case, a noise-based signal reduction can be restrained by establishing rules for access to successive banks. A first configuration therefor is that when a certain bank is activated, the activation of adjacent and its outer banks is prohibited until the bank is precharged. In doing so, at least two mats (banks) are inserted between the successively-activated banks. Thus, since the successively-activated reference bit lines BL exist in different mats in a manner similar to the case shown in FIGS. 2A and 2B, no noise is applied to each subsequently-activated reference bit line BL and a reading margin can be enlarged.

A second configuration is to offer such specs that after a certain bank is activated, the activation of each adjacent bank is prohibited unit the bank is precharged, and after a certain bank is activated or precharged, the activation of each adjacent bank and one outer bank is prohibited for a predetermined period. When a mat further next to the certain mat is activated in wait for the attenuation of noise produced in a non-selected word line WL, a plate PL and a substrate SUB offered or given on its adjacent mat by its activation, a noise-based signal reduction can be retrained and a reading margin can be enlarged.

Figure 13A:
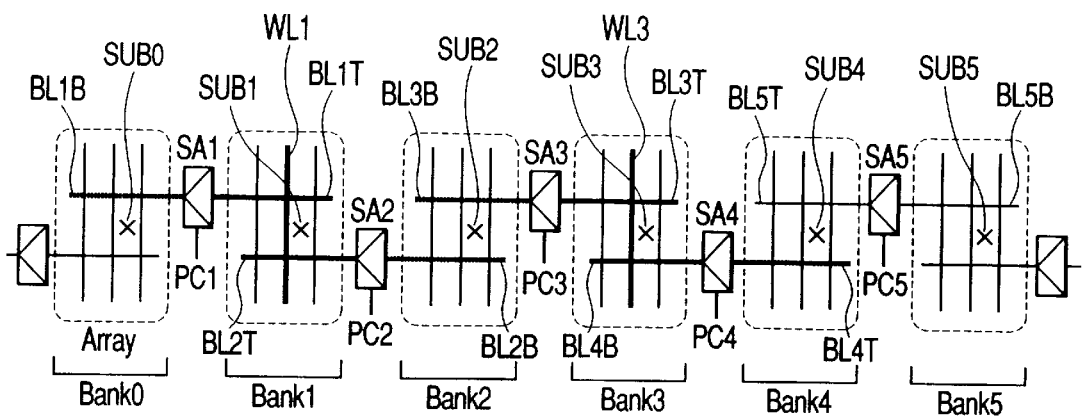
FIGS. 13A and 13B are respectively diagrams for describing an improper example of a bank selecting operation of the one-intersection array dependent bank DRAM.
Figure 13B:
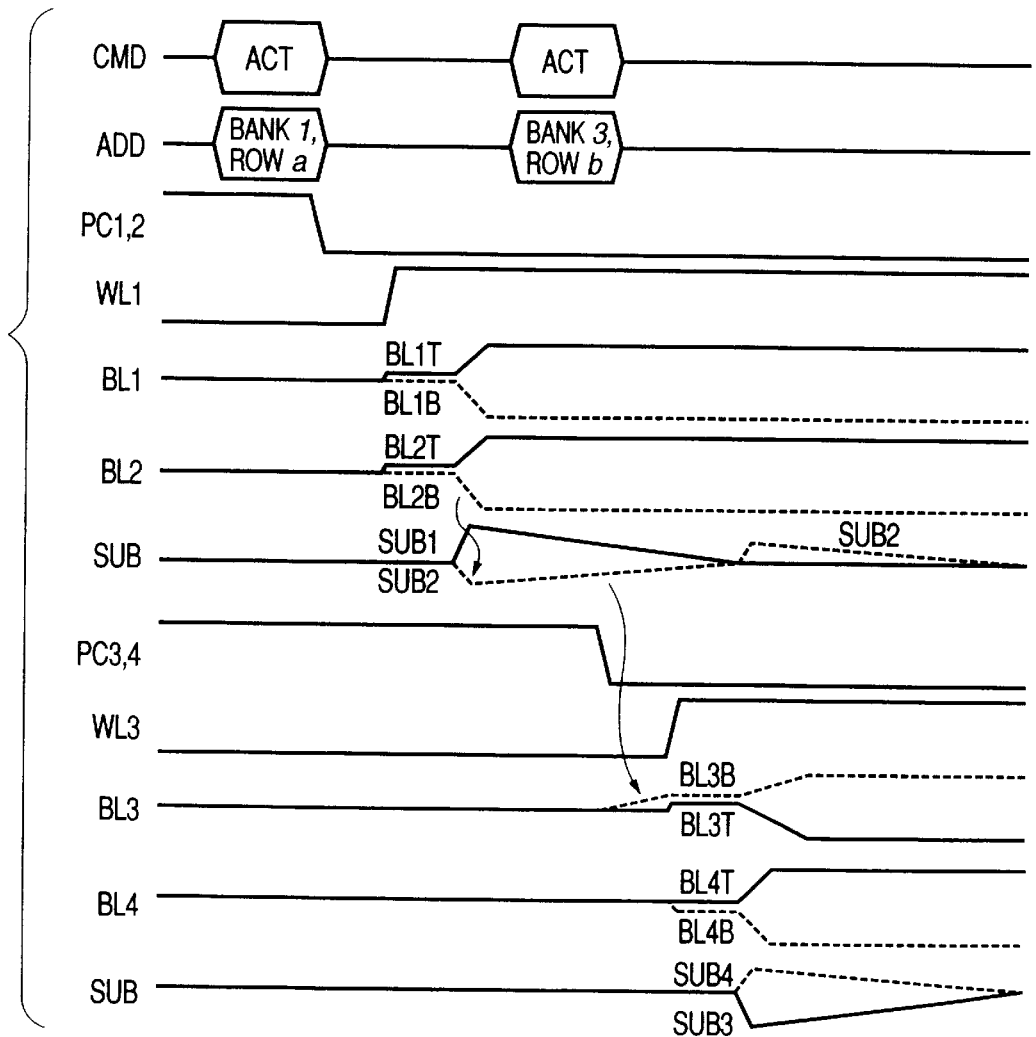

When an adjacent bank 3 is activated with one bank 2 interposed between a bank (Bank) 1 and the bank 3 while the bank (Bank) 1 is being activated in violation of the above first or second configuration, the following problem arises in the present embodiment. A configurational diagram and a waveform chart for describing the operation of the present embodiment are shown in FIGS. 13A and 13B. In FIG. 13A, an activation command ACT is inputted to a bank (Bank) 1 and a word line WL1 corresponding to it is activated. Thereafter, sense amplifiers SA1 and SA2 provided on both sides of such a bank 1 are started up.

When, as a worst case, high level (H) data are read out from all bit lines BL1, BL2T, etc. of the bank (Bank) 1, since the half of reference bit lines BL in a bank (Bank) 2 starting with a reference bit line BL2B corresponding to the bit line BL2T is amplified to a ground potential VSS, negative noise is developed in a substrate SUB 2, each word line, and a plate PL of the bank (Bank) 2. The same drawing shows only a substrate SUB. When a command is inputted to a bank (Bank) 3 prior to the attenuation of the noise, precharge PCs 3 and 4 of sense amplifiers SA3 and SA4 are cut off.

In doing so, a reference bit line BL3B of the bank 2, which is associated with a bit line BL3T of the bank 3, is subjected to noise from the substrate SUB 2, word line WL and plate PL of the mat 2 and hence the potential to be set to a half precharge potential increases. Even if a word line WL3 of the bank 3 is activated in this condition so that a high level signal is read to the bit line BL3T, the half precharge potential of the reference bit line BL3B is rendered high due to noise. Thus, a signal amount is relatively reduced and the relationship in potential between the bit line pair is erroneously inverted.

A similar reduction in signal amount takes place even when the bank (Bank) 3 is activated immediately after the bank (Bank) 1 is precharged. This problem will be explained with reference to FIGS. 14A and 14B. Assuming that a low level (L) is read out to all the bit lines in a preceding cycle of a bank (Bank) 1, all of reference bit lines (such as BL2B, etc.) in a bank (Bank) 2 are amplified to a high level potential VDL. When the bank (Bank) 1 is precharged according to a precharge command PRE, the low levels of the bit lines BL are restored to a reference potential VBLR all at once. Therefore, negative noise is produced in a substrate SUB 2 of the bank (Bank) 2.

When the precharge of SA3 is subsequently cut off to activate the bank (Bank) 3, a reference bit line BL3B corresponding to a bit line BL3T is subjected to noise from a substrate SUB 2, each word line and a plate PL of a mat 2 so that the potential applied thereto rises. When a word line WL3 of the bank 3 is activated in this condition and a high level signal is read out to the bit line BL3T, a signal amount is relatively reduced and the relationship in potential between the BL pairs is erroneously reversed.

Figure 14A:
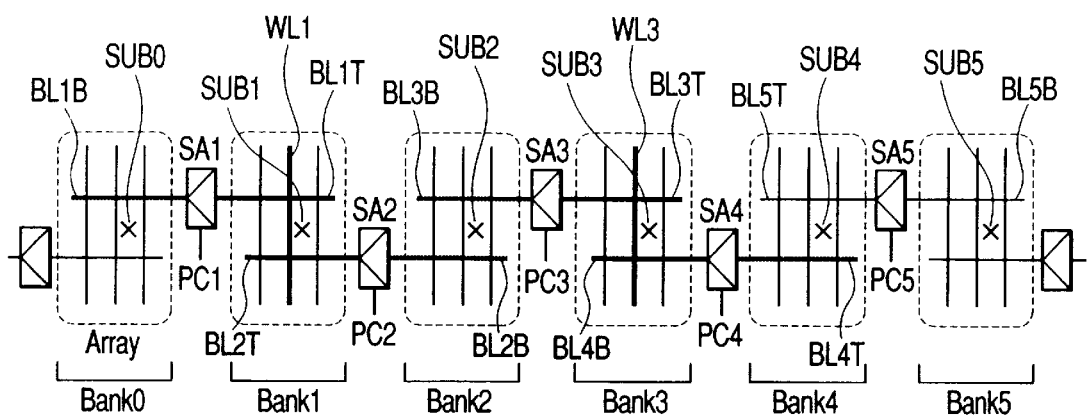
FIGS. 14A and 14B are respectively configurational diagrams for describing another improper example of a bank selecting operation of a one-intersection array dependent bank DRAM.
Figure 14B:
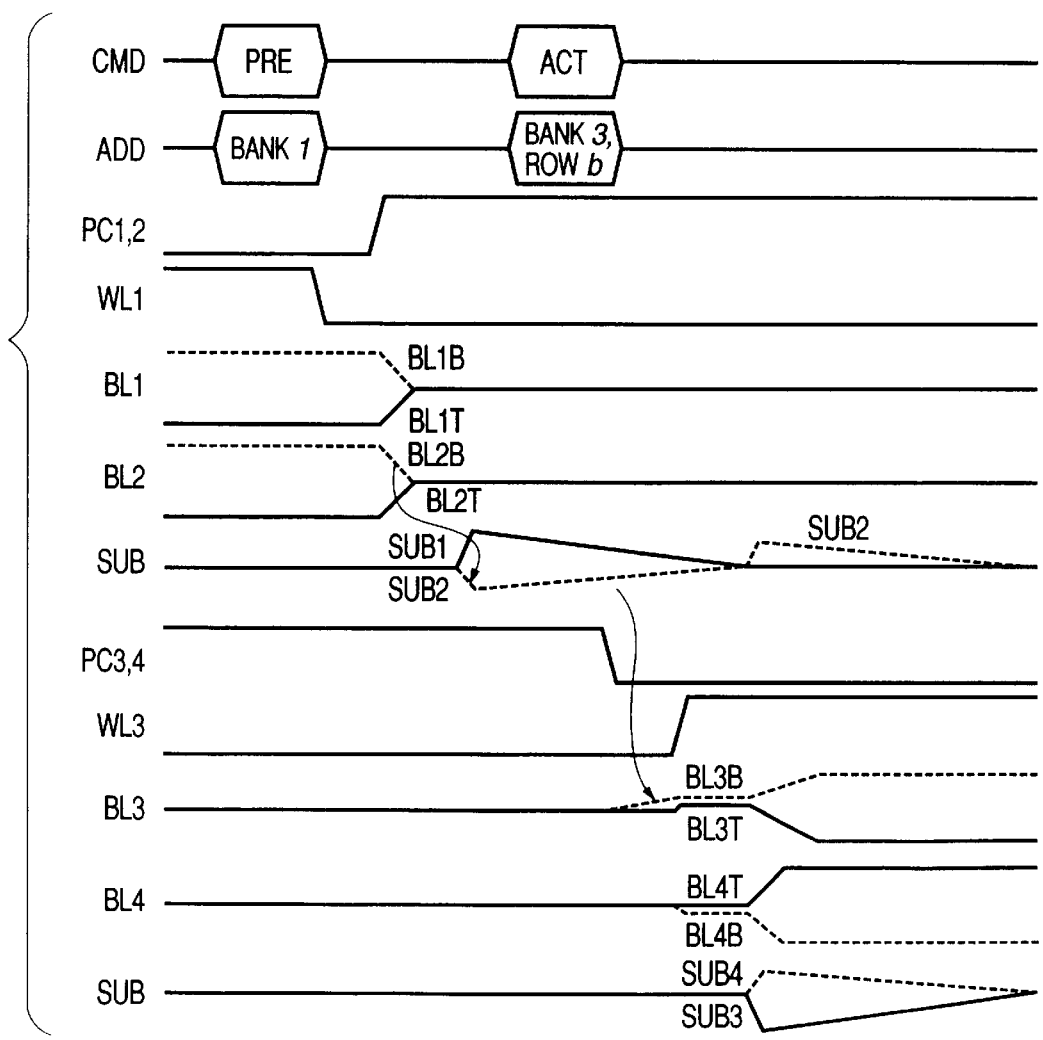

The activation of the adjacent bank 2 is allowed subsequently to the precharge of the bank 1. However, when a certain mat is precharged as shown in FIGS. 14A and 14B, noise is produced even in its adjacent mat. Thus, even when the two mats are assigned to one bank as shown in FIGS. 1A and 1B, a signal decreases upon reading of the bank 2 when the banks 1 and 2 are activated immediately after the bank 1 has been precharged. Therefore, when specs are made in such a manner that the banks 1 and 2 are activated in wait for a predetermined time in which noise developed in a non-selected word line WL, a plate PL and a substrate SUB of each of the banks 1 and 2 due to the precharge of the bank 1 is attenuated, a noise-based signal reduction can be restrained and a reading margin is enlarged or improved.

That is, when such a condition that each adjacent mat is activated for the predetermined period in which the noise developed in the non-selected word line WL, plate PL and substrate SUB is attenuated as described above, is offered where the two mats shown in FIG. 1A constitute one bank and one mat constitutes one bank, the noise-based signal reduction can be restrained and the reading margin can be enlarged or increased.

Figure 15:
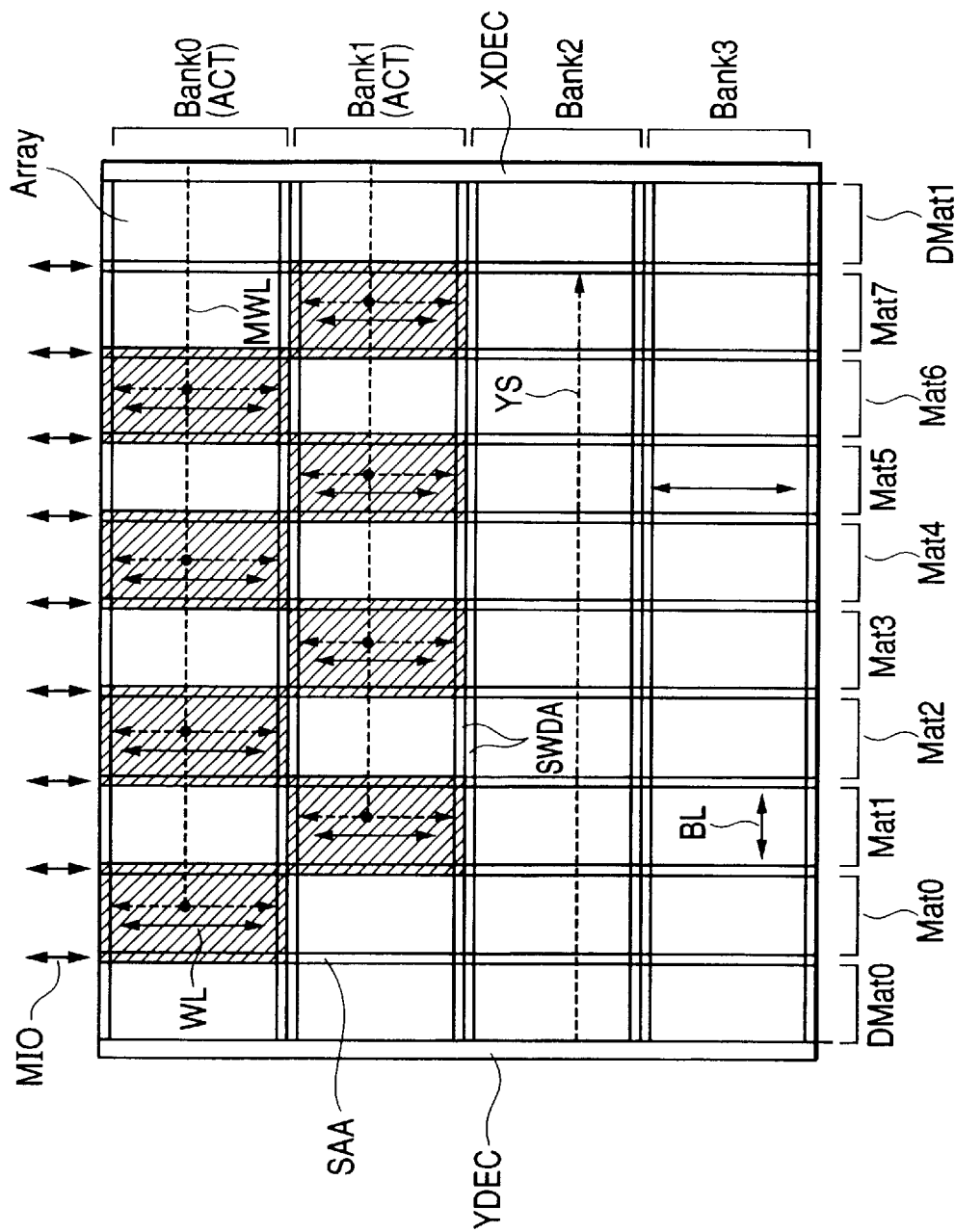
FIG. 15 is a configurational diagram showing one embodiment of a one-intersection independent bank DRAM according to the present invention.

FIG. 15 is a configurational diagram of a one-intersection independent bank DRAM according to the present invention. The present embodiment is characterized in that main word lines MWL extended or outputted from a row decoder (XDEC) are wired in the same direction as bit lines BL and inputted to sub-word driver arrays SWDA. Column select lines (YS) extended or outputted from a column decoder (YDEC) are wired in the same direction as the bit lines BL and inputted to sense amplifier arrays SAA.

Even in the present embodiment, areas surrounded by the sense amplifier arrays SAA and the sub-word driver arrays SWDA will be called "arrays (Arrays)". In the one-intersection independent bank DRAM illustrative of the present embodiment, arrays (Arrays) extending in a single horizontal row, which are arranged in a bit-line BL direction, constitute one bank. SWDA are placed on the boundary between adjacent banks in two rows.

One main word line MWL is inputted to its corresponding sub-word driver array SWDA between at least one array, and sense amplifiers SA are activated with at least one array interposed between the sub-word driver arrays SWDA. Since the respective banks can independently have the sense amplifiers SA and sub-word drivers SWD if done in this way, the activation of each word line WL and the holding of information in each sense amplifier SA can perfectly be performed in independent form. Further, since dummy mats DMats dedicated for reference bit lines BL are required for the outermost mats alone, the area of a chip can be reduced.

Figure 16:
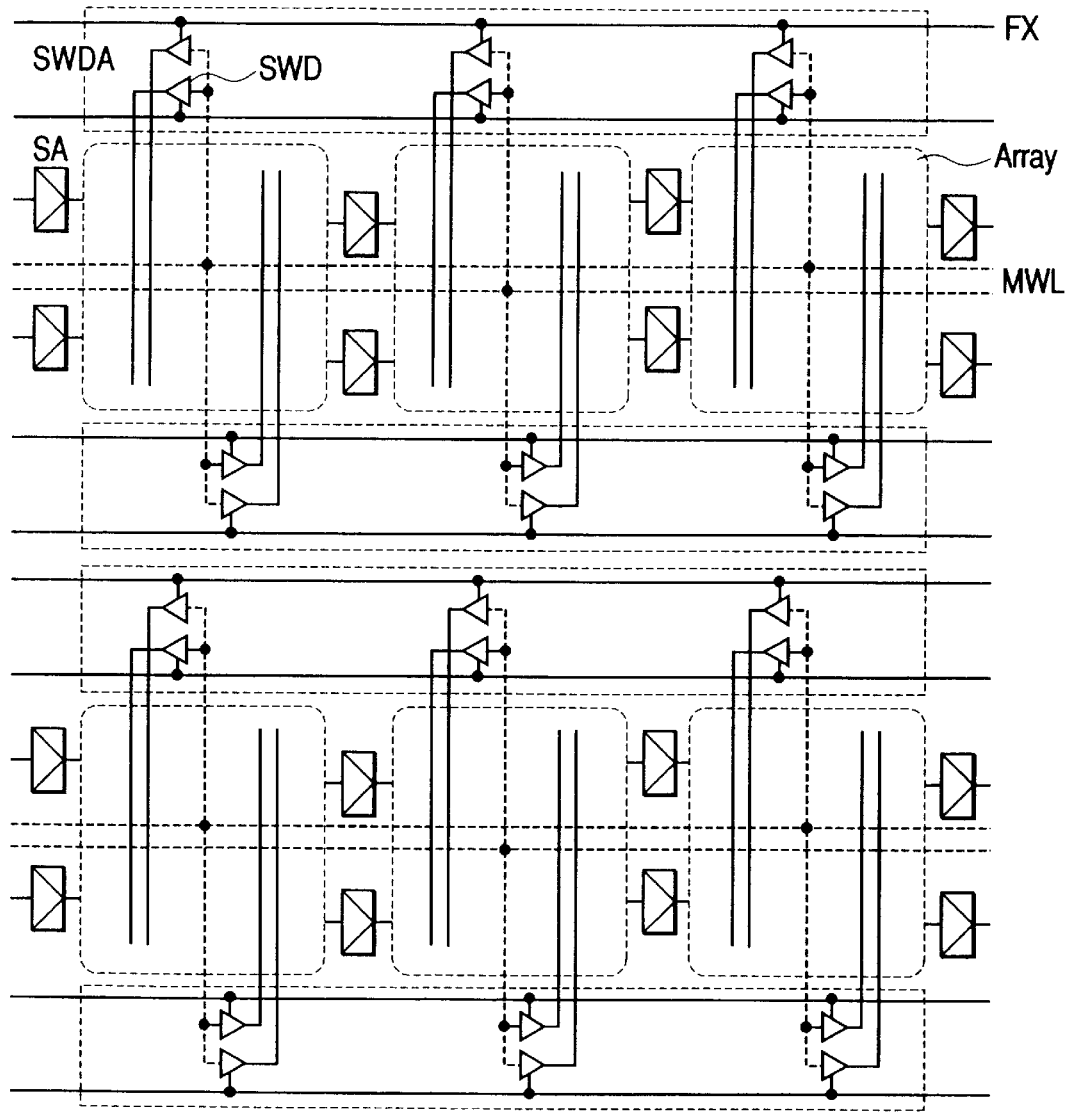
FIG. 16 is a word-line configurational diagram showing one embodiment of a one-intersection independent bank DRAM according to the present invention.

FIG. 16 is a word-line configurational diagram showing one embodiment of a one-intersection independent bank DRAM according to the present invention. The present embodiment is different from the embodiment shown in FIG. 5 in that sub-word driver arrays SWDA are placed in two rows on the boundary between arrays (Arrays), respective sub-word drivers SWD drive only word lines WL of one-sided array (Array), and main word lines MWL are wired in a bit-line BL direction. That is, banks are configured every arrays and the sub-word drivers SWD are provided every arrays, whereby the adjacent arrays (banks) can independently be accessed. In other words, since the corresponding word line in a bank 0 and the corresponding word line in a bank 1, both of which are adjacent to each other, can also be selected simultaneously, an independent bank DRAM can be provided.

In the present embodiment, the main word lines MWL are inputted to their corresponding sub-word drivers SWD on alternate arrays (Arrays). However, they may be set at intervals of two or more arrays. An advantage is brought about in that since the distance between the activated arrays is increased in doing so, array noise developed upon amplification of each bit line BL can be reduced, thereby improving a reading margin. Structures of input/output lines (LIO-MIO) can be set in a manner similar to the embodiment shown in FIG. 3 or 4.

Figure 21A:
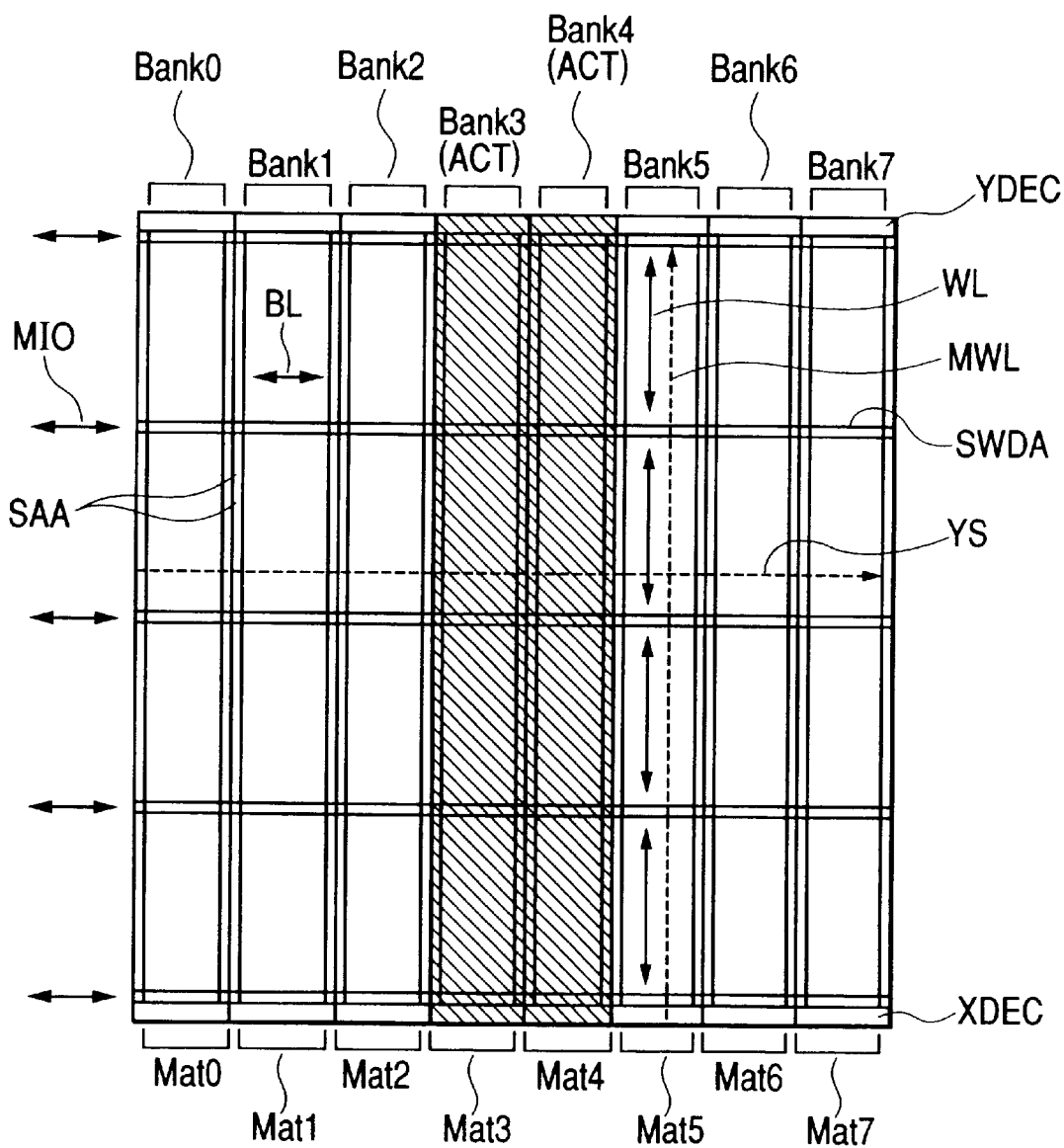

While the present embodiment shows the example in which the bit lines comprise one intersection, they may be configured by two intersections. Since each of sense amplifiers SA is one for amplifying the difference in voltage between complementary bit lines provided in the same array in a two-intersection system, it is considered that sense amplifiers SA are provided in the form of two pairs on the boundary between adjacent banks as shown in FIGS. 21A and 21B by way example, whereby the banks are set as independent banks. However, the sense amplifier SA needs many circuit elements as shown in FIG. 3 and thereby requires an occupied area and current consumption which are relatively large. On the other hand, each of sub-word drivers SWD can comprise a less number of elements like three as shown in FIG. 5. Further, since current consumption is low, high integration and low power consumption can be achieved owing to the adoption of such a bank configuration as described in the present embodiment even in the case of the two-intersection type arrays where an independent bank configuration is taken.

Figure 17:
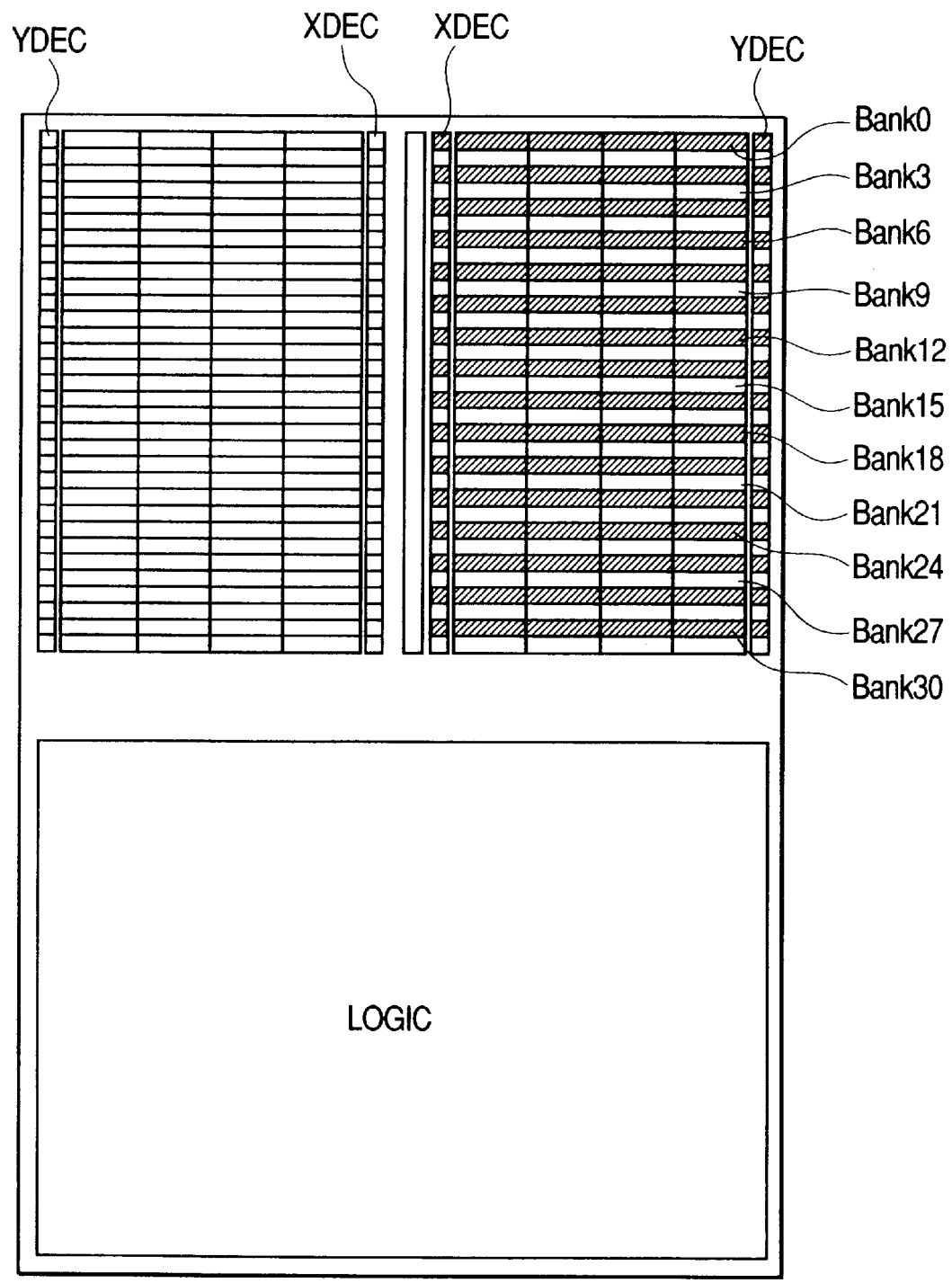
FIG. 17 is a chip configurational diagram of a logic mixed DRAM to which the present invention is applied.

FIG. 17 is a chip configurational diagram of a logic mixed DRAM to which the present invention is applied. A semiconductor integrated circuit device according to the present embodiment comprises a logic circuit unit LOGIC and a memory unit DRAM. The DRAM comprises two sets of memory units on a large scale. Each of the memory units adopts a multi-bank configuration which comprises 32 banks of banks 0 through 31. In the right memory unit shown in the same drawing, independently-accessible banks are represented as even-numbered banks with hatchings and open odd-numbered banks in parts. As to the respective banks, the two arrays constitute one bank as shown in FIG. 1 by way of example.

One memory unit whose number of banks is set to 32, has row decoders XDEC and column decoders YDEC which are respectively independent of one another in association with the respective banks. Further, each of sense amplifiers is shared between bit lines of arrays corresponding to both banks on the boundary between the banks. Therefore, the one-intersection array dependent bank DRAM is provided. Further, the activation of each adjacent bank is prohibited until a certain bank is precharged after the bank has been activated, whereby an operating margin is ensured.

Figure 18:
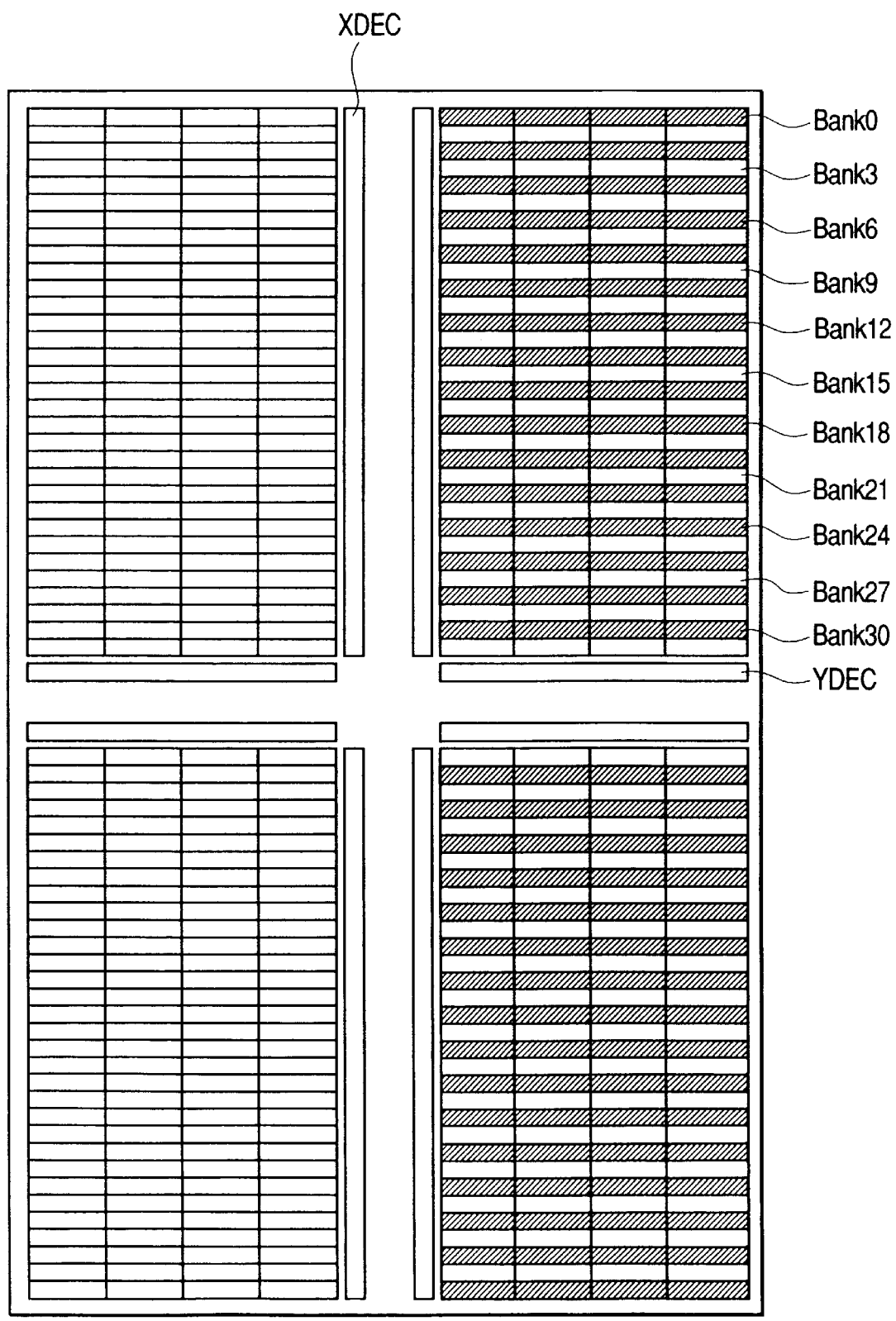
FIG. 18 is a chip overall configurational diagram of a dependent bank DRAM according to the present invention.

FIG. 18 is a chip overall configurational diagram of a dependent bank DRAM according to the present invention. The number of banks is 32, and a memory unit having these 32 banks is provided in the form of 4 sets as a whole. The respective banks have row decoders XDEC independently but share the use of a column decoder YDEC, an address buffer ADB and input/output buffers (DIB and DOB). Since the present DRAM is similar in other configurations to FIG. 17, the description thereof will be omitted.

Figure 19:
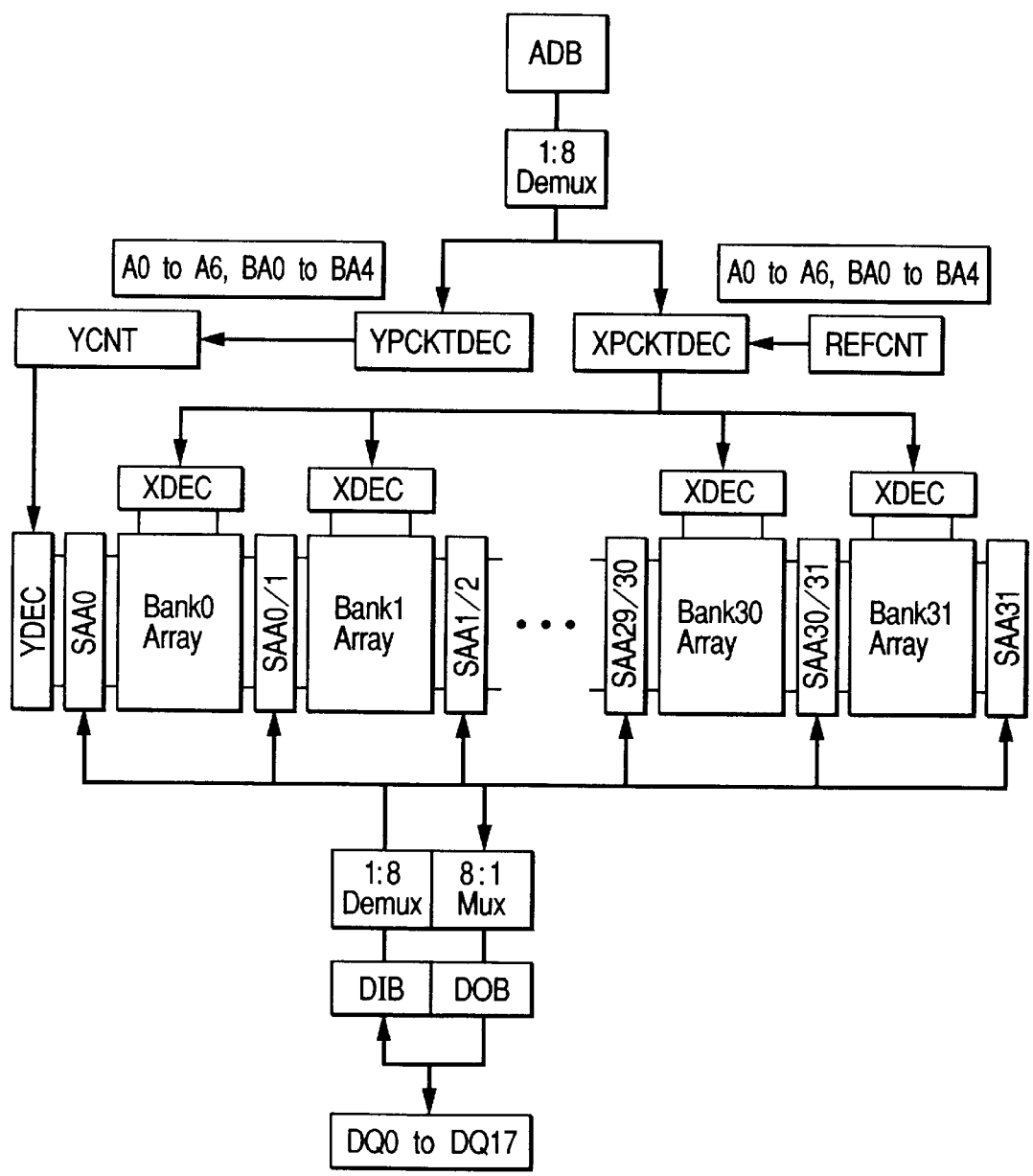
FIG. 19 is a block diagram showing one embodiment of the dependent bank DRAM according to the present invention.

FIG. 19 is a block diagram of one embodiment of a dependent bank DRAM according to the present invention. The present embodiment adopts a one-intersection system in which sense amplifier arrays (SAA) are respectively shared between adjacent banks. For instance, both a bank 0 (Bank0) and a bank 1 (Bank1) use SAA0/1. XPCKTDEC indicates a row packet decoder, YPCKTDEC indicates a column packet decoder, and Demux indicates a demultiplexer, which converts write data inputted in 16-bit units, for example, to 128 bits of ×8 and performs its writing operation. Mux indicates a multiplexer, which selects 128-bit data in the form of ⅛ and outputs it in 16-bit units.

YCNT indicates a Y counter, which advances a Y address according to a clock on the basis of an initial address inputted from the column packet decoder YPCKTDEC. Thus, a memory access in a burst mode is allowed. REFCNT indicates an automatic refresh circuit, which generates a refresh address and sequentially selects word lines in each bank through the packet decoder XPCKTDEC to thereby perform a refresh operation of each memory cell.

Figure 20A:
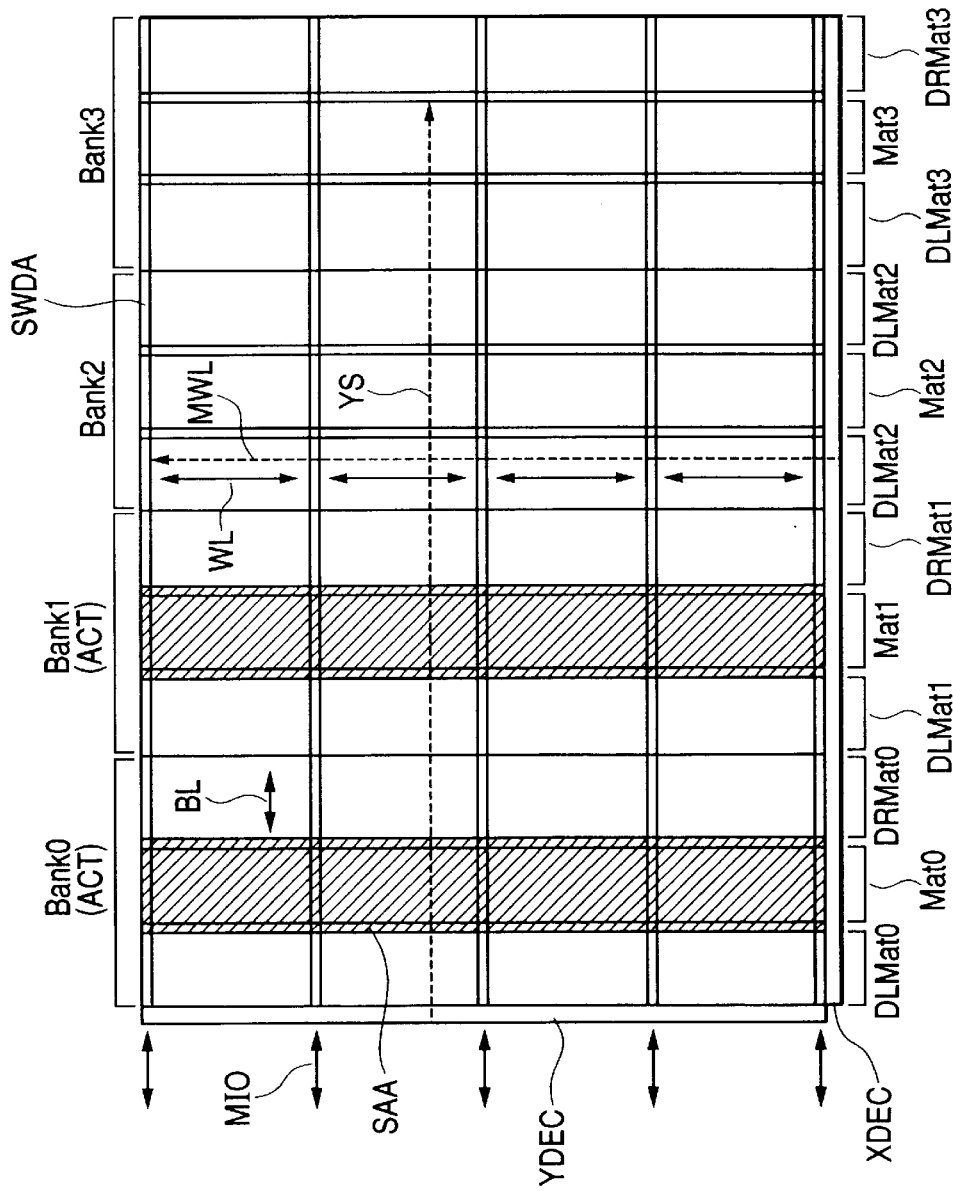
FIGS. 20A and 20B are respectively configurational diagrams of a one-intersection independent bank DRAM discussed prior to the present invention.
Figure 20B:
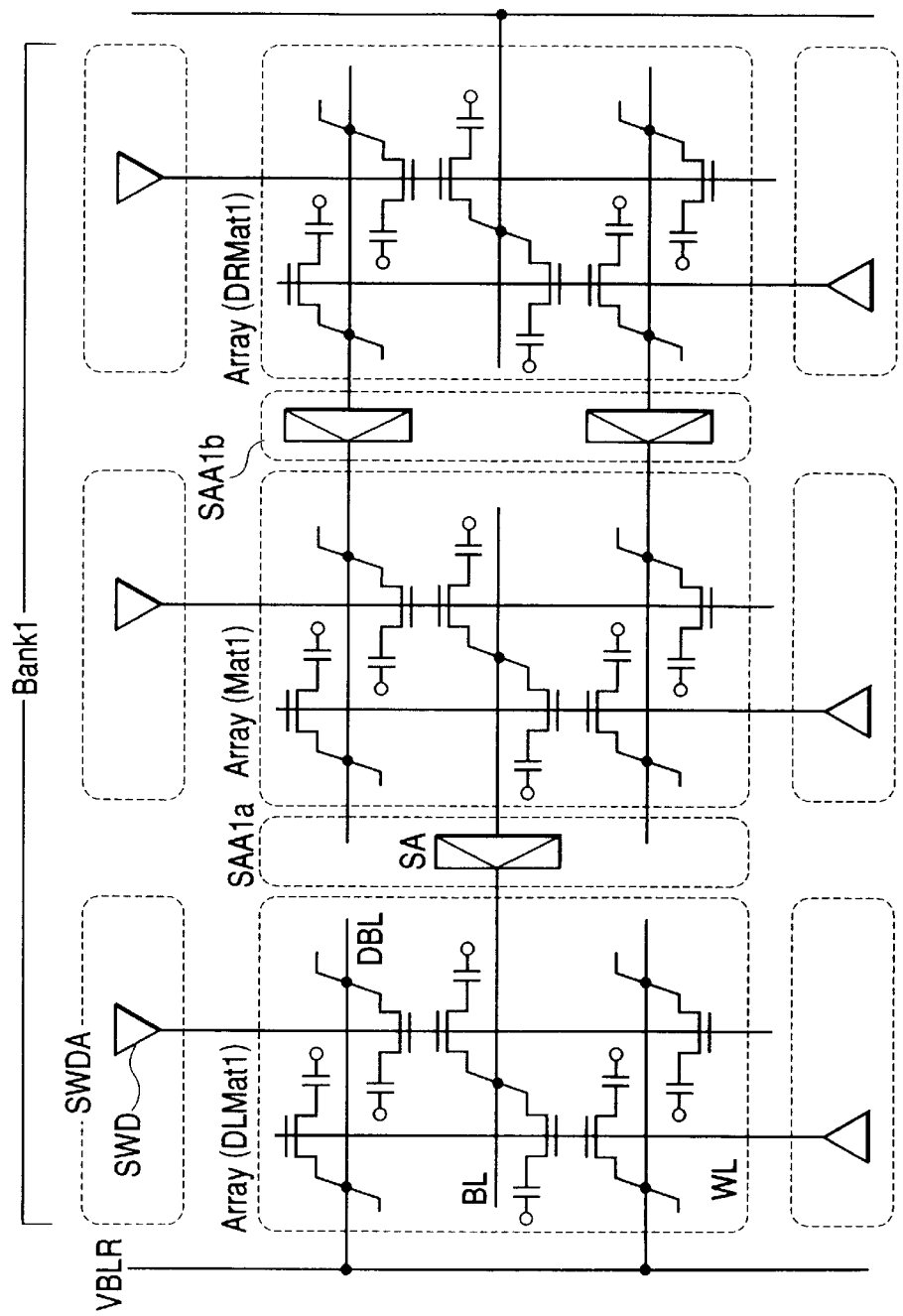

The multi-bank configured DRAM according to the present invention is one wherein sufficient consideration has been given even to high integration corresponding to the characteristic of the DRAM as well as countermeasures against noise through the above-described non-selected word lines, plate or substrate. When an independent bank configuration is taken using one-intersection arrays as shown in FIGS. 20A and 20B by way of example, one bank can be configured using three arrays.

That is, since it is necessary to use bit lines in each adjacent mat as reference bit lines in the case of a one-intersection array, each reference mat is needed next door to the normal mat. Since the reference mats also has need to be provided in independent form in order to perfectly separate the operations of the respective banks from one another, it is necessary to form one bank by a minimum of three mats including the reference mats (DLMat0 and DRMat0) next door to the normal mat (Mat0). On the other hand, the half of bit lines in each reference mat is fixed to a VBLR and used as dummy bit lines disconnected from sense amplifiers. Therefore, the reference mats is wastefully lost in half area. Thus, the number of dummy mats increases as the number of banks increases like 32 banks, and unprofitable areas greatly increases. It is thus useless to use the DRAM.

On the other hand, the above-described dependent bank DRAM is adopted in the case of one-intersection arrays in the invention of the present application. Further, the high integration and operating margin can be ensured by such a simple configuration that the operation of selecting its bank is partly restricted. In the present application, the concept of the bank is widely used in a synchronous DRAM or the like and used in the sense or meaning similar thereto.

In the DRAM, an electrical charge is associated with 1 and 0 of binary information according to whether the electrical charge exists in each storage capacitor. Thus, when a word line is selected, the state of an original stored charge is lost due to the charge coupling with a precharge electrical charge on a bit line. Therefore, such a refresh or rewrite operation that a signal read from the bit line is amplified by the corresponding sense amplifier and restored to the original charge state is absolutely necessary. Thus, the operation of selecting each word line is always closely related to the operation of each sense amplifier in the DRAM. According to this point of view, the timing provided to select the corresponding word line or an address for selecting the word line can be set independently. This substantially leads to the same meaning from the viewpoint of the operation of the DRAM even if the concept of the bank is not used.

In the present application as described above, the term "MOS" is understood as a metal oxide semiconductor configuration originally called for simplicity or brevity. However, the recent generally-named MOSs include those obtained by changing a metal of essential portions of a semiconductor device to an electrical conductor such as polysilicon which does not belong to the metal and changing oxide to another insulator. Also CMOSs are now understood as having a wide technical meaning corresponding to a change in how to grasp the MOSs referred to above. MOSFETs are also similarly taken as the meaning including such a wide construction as substantially taken as an insulated-gate field effect transistor without being understood in a narrow sense. CMOSs, MOSFETs, etc. employed in the present invention follow general naming.

Operations and effects obtained from the above-described embodiments are as follows:

(1) An advantageous effect is obtained in that a semiconductor memory can be implemented in which a plurality of sense amplifier areas placed alternately to a plurality of memory array areas placed along a first direction are provided, the plurality of memory array areas are respectively provided with a plurality of bit lines provided along the first direction, a plurality of word lines provided along a second direction intersecting the first direction, and a plurality of memory cells provided so as to correspond to portions where the plurality of bit lines and the plurality of word lines intersect, sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, and respective word-line selecting timings with respect to the two memory array areas away from each other with the two or more memory array areas interposed therebetween are independently controlled, whereby high integration thereof and the stabilization of its operation can be implemented.

(2) In addition to the above, an advantageous effect is obtained in that a semiconductor memory can be implemented wherein the respective word-line selecting timings with respect to the two memory array areas away from each other with the one memory array area interposed therebetween are controlled with displacements of predetermined periods, whereby the influence of noise produced in association with the word-line selecting timings can be eliminated, thereby improving the stabilization of operation thereof and usability thereof.

(3) In addition to the above, an advantageous effect is obtained in that the memory cells are provided as dynamic memory cells which respectively comprise MOSFETs and capacitors, and the MOSFETs have gates provided as selection terminals, one thereof having a source and drain provided as input/output terminals and the other thereof having a source and drain connected to a storage node corresponding to one electrode of each of the capacitors, and the other electrode of each of the capacitors provided in each of memory arrays comprises an integrated plate electrode, whereby high integration can be implemented.

(4) An advantageous effect is obtained in that a semiconductor memory can be implemented wherein a plurality of sense amplifier areas placed alternately to a plurality of memory array areas placed along in a first direction are provided, the plurality of memory array areas are respectively provided with a plurality of bit lines provided along the first direction, a plurality of word lines provided along a second direction intersecting the first direction, and a plurality of memory cells respectively provided in association with portions where the plurality of bit lines and the plurality of word lines intersect, sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, and respective word-line selecting addresses with respect to the two memory array areas away from each other with the two or more memory array areas interposed therebetween are independently controlled, whereby high integration thereof and the stabilization of its operation are realized.

(5) In addition to the above, an advantageous effect is obtained in that the memory cells are respectively provided as dynamic memory cells which respectively comprise MOSFETs and capacitors, one thereof having a source and drain provided as input/output terminals and the other thereof having a source and drain connected to a storage node corresponding to one electrode of each of the capacitors, and the other electrode of each of the capacitors provided in each of memory arrays comprises an integrated plate electrode, whereby high integration can be implemented.

(6) An advantageous effect is obtained in that a semiconductor memory can be implemented wherein a plurality of sense amplifier areas placed alternately to a plurality of memory array areas placed along a first direction are provided, the plurality of memory array areas are respectively provided with a plurality of bit lines provided along the first direction, a plurality of word lines provided along a second direction intersecting the first direction, and a plurality of memory cells respectively provided in association with portions where the plurality of bit lines and the plurality of word lines intersect, sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, the two memory array areas provided adjacent to each other constitute one of a plurality of banks, and respective word-line selecting timings with respect to two banks away from each other with one of the plurality of banks interposed therebetween are independently controlled, whereby high integration thereof and the stabilization of its operation are implemented.

(7) In addition to the above, an advantageous effect is obtained in that a semiconductor memory can be implemented wherein the respective word-line selecting timings with respect to the two banks adjacent to each other, of the plurality of banks are controlled with displacements of predetermined periods, whereby the influence of noise produced in association with the word-line selecting timings can be eliminated, thereby improving the stabilization of operation thereof and usability thereof.

(8) In addition to the above, an advantageous effect is obtained in that the memory cells are respectively dynamic memory cells which respectively comprise MOSFETs and capacitors, the MOSFETs having gates provided as selection terminals, one thereof having a source and drain provided as input/output terminals and the other thereof having a source and drain connected to a storage node corresponding to one electrode of each of the capacitors, and the other electrode thereof of the capacitors provided in each of memory arrays comprises an integrated plate electrode, whereby high integration can be implemented.

(9) An advantageous effect is obtained in that a semiconductor memory having a multi-bank configuration can be implemented wherein a plurality of sense amplifier areas placed alternately to the plurality of memory array areas placed along a first direction are provided, the plurality of memory array areas are respectively provided with a plurality of bit lines extending in the first direction, a plurality of word lines provided along a second direction intersecting the first direction, and a plurality of memory cells respectively provided in association with portions where the plurality of bit lines and the plurality of word lines intersect, sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, the two memory array areas provided adjacent to each other constitute one of a plurality of banks, and respective word-line selecting addresses with respect to two banks away from each other with one of the plurality of banks interposed therebetween are independently set, whereby high integration thereof and the stabilization of its operation are implemented.

(10) In addition to the above, the memory cells are respectively provided as dynamic memory cells which respectively comprise MOSFETs and capacitors, the MOSFETs having gates provided as selection terminals, one thereof having a source and drain provided as input/output terminals and the other thereof having a source and drain connected to a storage node corresponding to one electrode of each of the capacitors, and the other electrode thereof of the capacitors provided in each of memory arrays comprises an integrated plate electrode, whereby high integration can be realized.

(11) An advantageous effect is obtained in that a semiconductor memory having a multi-bank configuration can be implemented wherein a plurality of sense amplifier areas placed alternately to a plurality of memory array areas placed along a first direction are provided, the plurality of memory array areas are respectively provided with a plurality of bit lines provided along the first direction, a plurality of word lines provided along a second direction intersecting the first direction, and a plurality of memory cells provided in association with portions where the plurality of bit lines and the plurality of word lines intersect, sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, the one memory array area constitutes one of a plurality of banks, and respective word-line selecting addresses with respect to two banks away from each other with two of the plurality of banks interposed therebetween are independently set, whereby high integration thereof and the stabilization of its operation are implemented.

(12) In addition to the above, an advantageous effect is obtained in that the activation of two banks away from each other with one bank interposed therebetween is prohibited during a period in which a small signal is amplified by each of the sense amplifiers, whereby usability can be improved while the stabilization of operation is being achieved.

(13) In addition to the above, an advantageous effect is obtained in that when one of two banks away from each other with one bank interposed therebetween is activated, the activation of the other thereof is allowed with a delay of a predetermined time, whereby usability can be improved while the stabilization of operation is being achieved.

(14) In addition to the above, an advantageous effect is obtained in that the memory cells are respectively provided as dynamic memory cells which respectively comprise MOSFETs and capacitors, the MOSFETs having gates provided as selection terminals, the one MOSFET having a source and drain provided as input/output terminals and the other MOSFET having a source and drain connected to a storage node corresponding to one electrode of each of the capacitors, and the other electrode thereof of the capacitors provided in each of memory arrays comprises an integrated plate electrode, whereby high integration can be implemented.

(15) An advantageous effect is obtained in that a semiconductor memory can be implemented wherein a plurality of word-line selecting areas placed alternately to a plurality of memory array areas placed along a first direction are provided, the plurality of memory array areas are respectively provided with a plurality of word lines provided along the first direction, a plurality of bit lines provided along a second direction intersecting the first direction, and a plurality of memory cells respectively provided in association with portions where the plurality of word lines and the plurality of bit lines intersect, word-line selecting circuits are provided within the respective word-line selecting areas in association with the respective word lines extending to one of the memory array areas on both sides adjacent to the respective word-line selecting areas and the respective word lines extending to the other thereof, and respective word-line selecting timings with respect to the respective memory array areas are independently controlled, whereby high integration thereof and the stabilization of its operation are implemented.

(16) In addition to the above, an advantageous effect is obtained in that each of the word-line selecting circuits selects one of sub-word lines provided in each of memory arrays, and a main word line for transferring a select signal to the word-line selecting circuit is caused to extend in the second direction, whereby respective word-line selecting timings with respect to the memory array areas can be controlled independently.

(17) In addition to the above, an advantageous effect is obtained in that the bit lines provided in each memory array are provided as complementary bit line pairs which extend in parallel, whereby high integration can be achieved.

(18) In addition to the above, an advantageous effect is obtained in that a plurality of memory arrays are provided even in the second direction, a plurality of sense amplifier areas placed alternately with respect to the plurality of memory array areas are further provided, and sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, whereby high integration can be achieved.

(19) In addition to the above, an advantageous effect is obtained in that the memory cells are respectively provided as dynamic memory cells which respectively comprise MOSFETs and capacitors, the MOSFETs having gates provided as selection terminals, the one MOSFET having a source and drain provided as input/output terminals and the other MOSFET having a source and drain connected to a storage node corresponding to one electrode of each of the capacitors, and the other electrode thereof of the capacitors provided in each of memory arrays comprises an integrated plate electrode, whereby high integration can be implemented.

(20) An advantageous effect is obtained in that a semiconductor memory can be implemented wherein a first memory mat including a plurality of first bit lines, a plurality of first word lines, and a plurality of first memory cells respectively connected to the plurality of first bit lines and the plurality of first word lines, and a second memory mat including a plurality of second bit lines, a plurality of second word lines, and a plurality of second memory cells respectively connected to points where the plurality of second bit lines and the plurality of second word lines intersect are provided, a plurality of sense amplifiers are provided in an area defined between the first memory mat and the second memory mat, each of the plurality of sense amplifiers is connected to the corresponding one of the plurality of first bit lines and the corresponding one of the plurality of second bit lines, each of the plurality of first memory cells comprises a first capacitor having a first and a second electrodes, and a first transistor having a gate connected to the corresponding one of the plurality of first word lines and source-drain paths one of which is connected to the corresponding one of the plurality of first bit lines and the other of which is connected to the first electrode of the first capacitor, each of the plurality of second memory cells comprises a second capacitor having a third and a fourth electrodes, and a second transistor having a gate connected to the corresponding one of the plurality of second word lines and source-drain paths one of which is connected to the corresponding one of the plurality of second bit lines and the other of which is connected to the fourth electrode of the second capacitor, each of the second electrodes of the first capacitors included in the plurality of first memory cells and each of the fourth electrodes of the second capacitors included in the plurality of second memory cells are connected to one conductive layer placed over the second memory mat and the plurality of sense amplifiers, and respective word-line selecting addresses with respect to two memory mats away from each other with the two or more memory mats interposed therebetween are independently set, whereby high integration thereof and the stabilization of its operation are implemented.

(21) An advantageous effect is obtained in that a semiconductor memory can be implemented wherein a first memory mat including a plurality of first bit lines, a plurality of first word lines, and a plurality of first memory cells respectively connected to the plurality of first bit lines and the plurality of first word lines, and a second memory mat including a plurality of second bit lines, a plurality of second word lines, and a plurality of second memory cells respectively connected to point where the plurality of second bit lines and the plurality of second word lines intersect, are provided, a plurality of sense amplifiers are provided in an area defined between the first memory mat and the second memory mat, each of the plurality of sense amplifiers is connected to the corresponding one of the plurality of first bit lines and the corresponding one of the plurality of second bit lines, each of the plurality of first memory cells comprises a first capacitor having a first and a second electrodes, and a first transistor having a gate connected to the corresponding one of the plurality of first word lines and source-drain paths one of which is connected to the corresponding one of the plurality of first bit lines and the other of which is connected to the first electrode of the first capacitor, each of the plurality of second memory cells comprises a second capacitor having a third and a fourth electrodes, and a second transistor having a gate connected to the corresponding one of the plurality of second word lines and source-drain paths one of which is connected to the corresponding one of the plurality of second bit lines and the other of which is connected to the fourth electrode of the second capacitor, each of the second electrodes of the first capacitors included in the plurality of first memory cells and each of the fourth electrodes of the second capacitors included in the plurality of second memory cells are connected to one conductive layer placed over the second memory mat and the plurality of sense amplifiers, two mats provided adjacent to each other constitute one of a plurality of banks, and respective word-line selecting addresses with respect to two banks away from each other with one of the plurality of banks interposed therebetween are independently set, whereby high integration thereof and the stabilization of its operation are implemented.

While the invention made by the present inventors above has been described specifically by the embodiments, the invention of the present application is not limited to the embodiments. It is needless to say that various changes can be made thereto within the scope not departing from the substance thereof. For instance, memory cells may be ones non-volatilized using a ferroelectric capacitor as memory means in addition to the dynamic memory cell. The ferroelectric capacitor may be used for both a non-volatile mode and a volatile mode similar to the dynamic memory cell according to the magnitude of a voltage applied to its dielectric film. Various embodiments such as ones applicable to a Rambus configuration or a synchronous DRAM, etc. or one placed on the logic circuit, etc. can be adopted as input/output interfaces for a dynamic RAM.

Advantageous effects obtained by typical ones of the inventions disclosed in the present application will be explained in brief as follows. A semiconductor memory can be implemented in which a plurality of sense amplifier areas placed alternately to a plurality of memory array areas placed along a first direction are provided, the plurality of memory array areas are respectively provided with a plurality of bit lines provided along the first direction, a plurality of word lines provided along a second direction intersecting the first direction, and a plurality of memory cells provided so as to correspond to portions where the plurality of bit lines and the plurality of word lines intersect, sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, and respective word-line selecting timings or addresses with respect to the two memory array areas away from each other with the two or more memory array areas interposed therebetween are independently set, whereby high integration thereof and the stabilization of its operation can be realized.

A semiconductor memory having a multi-bank configuration can be implemented wherein a plurality of sense amplifier areas placed alternately to a plurality of memory array areas placed along a first direction are provided, the plurality of memory array areas are respectively provided with a plurality of bit lines provided along the first direction, a plurality of word lines provided along a second direction intersecting the first direction, and a plurality of memory cells respectively provided in association with portions where the plurality of bit lines and the plurality of word lines intersect, sense amplifiers each of which receives therein a pair of signals from each of the bit lines extending to one of the memory array areas on both sides adjacent to the respective sense amplifier areas and each of the bit lines extending to the other thereof, are provided within the respective sense amplifier areas, the two memory array areas provided adjacent to each other constitute one of a plurality of banks, and respective word-line selecting addresses with respect to two banks away from each other with one of the plurality of banks interposed therebetween are independently set, whereby high integration thereof and the stabilization of its operation are implemented.

We claim:

1. A semiconductor memory comprising:

a plurality of memory array areas placed along a first direction; and a plurality of sense amplifier areas placed alternately to said plurality of memory array areas, wherein said plurality of memory array areas respectively have a plurality of bit lines provided along the first direction, a plurality of word lines provided along a second direction intersecting the first direction, and a plurality of memory cells provided in association with portions where the plurality of bit lines and the plurality of word lines intersect, wherein sense amplifiers, each of which receives a first signal from one of a pair of bit lines extending to one of the memory array areas on one side adjacent to the respective sense amplifier areas and receives a second signal from the other of the pair of bit lines extending to another of the memory array areas on an opposite side adjacent to the respective sense amplifier areas, are provided within said respective sense amplifier areas, and wherein respective word-line selecting timings with respect to two of the memory array areas, separated from each other with two or more different ones of the memory array areas interposed therebetween, are independently controlled.

2. The semiconductor memory according to claim 1, wherein the respective word-line selecting timings with respect to two of the memory array areas, separated from each other with one of the memory array areas interposed therebetween, are controlled with displacements of predetermined periods.

3. The semiconductor memory according to claim 1 or 2, wherein said memory cells are dynamic memory cells which respectively comprise MOSFETs and capacitors, said MOSFETs having gates provided as selection terminals, said one MOSFET having a source and drain provided as input/output terminals and said other MOSFET having a source and drain connected to a storage node corresponding to one electrode of each of said capacitors, and wherein the other electrode thereof of said capacitors provided in each of memory arrays comprises an integrated plate electrode.

4. A semiconductor memory comprising:

a plurality of memory array areas; and a plurality of sense amplifier areas placed alternately to said plurality of memory array areas, wherein said plurality of memory array areas respectively have a plurality of bit lines, a plurality of word lines respectively intersecting said plurality of bit lines, and a plurality of memory cells respectively provided in association with portions where said plurality of bit lines and said plurality of word lines intersect, wherein sense amplifiers, each of which receives a first signal from one of a pair of bit lines extending to one of the memory array areas on one side adjacent to the respective sense amplifier areas and receives a second signal from the other of the pair of bit lines extending to another of the memory array areas on an opposite side adjacent to the respective sense amplifier areas, are provided within said respective sense amplifier areas, and wherein two of the memory array areas provided adjacent to each other constitute one of a plurality of banks, and respective word-line selecting timings with respect to two banks, separated from each other with at least one of the plurality of banks interposed therebetween, are independently controlled.

5. The semiconductor memory according to claim 4, wherein the respective word-line selecting timings with respect to two of the banks adjacent to each other, of said plurality of banks, are controlled with displacements of predetermined periods.

6. The semiconductor memory according to claim 4 or 5, wherein said memory cells are respectively dynamic memory cells which respectively comprise MOSFETs and capacitors, said MOSFETs having gates provided as selection terminals, said one MOSFET having a source and drain provided as input/output terminals and said other MOSFET having a source and drain connected to a storage node corresponding to one electrode of each of said capacitors, and wherein the other electrode thereof of said capacitors provided in each of memory arrays comprises an integrated plate electrode.

7. A semiconductor memory comprising:

a plurality of memory array areas placed along a first direction; and a plurality of word-line selecting areas placed alternately to said plurality of memory array areas, wherein said plurality of memory array areas are respectively provided with a plurality of word lines provided along the first direction, a plurality of bit lines provided along a second direction intersecting the first direction, and a plurality of memory cells respectively provided in association with portions where said plurality of word lines and said plurality of bit lines intersect, wherein word-line selecting circuits are provided within the respective word-line selecting areas in association with the respective word lines extending to one of the memory array areas on both sides adjacent to the respective word-line selecting areas and the respective word lines extending to the other thereof, and wherein respective word-line selecting timings with respect to the respective memory array areas are independently controlled.

8. The semiconductor memory according to claim 7, wherein said each word-line selecting circuit selects each of sub-word lines provided in each of memory arrays, and wherein a main word line for transferring a select signal to said word-line selecting circuit extends in the second direction.

9. The semiconductor memory according to claim 7 or 8, wherein the bit lines provided in said each memory array are complementary bit line pairs which extend in parallel.

10. The semiconductor memory according to claim 7 or 9, wherein a plurality of memory arrays are provided even in the second direction, a plurality of sense amplifier areas placed alternately with respect to the plurality of memory array areas are further provided, and wherein sense amplifiers each of which receives therein a pair of signals from each of the bit lines extending to one of the memory array areas on both sides adjacent to the respective sense amplifier areas and each of the bit lines extending to the other thereof, are provided within said respective sense amplifier areas.

11. The semiconductor memory according to any of claims 7 to 10, wherein the memory cells are respectively dynamic memory cells which respectively comprise MOSFETs and capacitors, said MOSFETs having gates provided as selection terminals, said one MOSFET having a source and drain provided as input/output terminals and said other MOSFET having a source and drain connected to a storage node corresponding to one electrode of each of said capacitors, and wherein the other electrode thereof of said capacitors provided in each of memory arrays comprises an integrated plate electrode.

12. A semiconductor memory having an open-bit line memory array comprising:

a plurality of memory array areas placed along a first direction; and a plurality of sense amplifier areas placed alternately to said plurality of memory array areas, wherein said plurality of memory array areas respectively have a plurality of bit lines provided along the first direction, a plurality of word lines provided along a second direction intersecting the first direction, and a plurality of memory cells provided in association with portions where the plurality of bit lines and the plurality of word lines intersect, wherein sense amplifiers, each of which receives a first signal from one of a pair of bit lines extending to one of the memory array areas on one side adjacent to the respective sense amplifier areas and receives a second signal from the other of the pair of bit lines extending to another of the memory array areas on an opposite side adjacent to the respective sense amplifier areas, are provided within said respective sense amplifier areas, and means for reducing array noise on said bit lines, said means comprising independently controlling respective word-line selecting timings with respect to two of the memory array areas, separated from each other with two or more different ones of the memory array areas interposed therebetween.

13. The semiconductor memory according to claim 12, wherein said means further comprises controlling the respective word-line selecting timings with respect to two of the memory array areas, separated from each other with one of the memory array areas interposed therebetween, with displacements of predetermined periods.

14. A semiconductor memory having an open-bit line memory array comprising:

a plurality of memory array areas; and a plurality of sense amplifier areas placed alternately to said plurality of memory array areas, wherein said plurality of memory array areas respectively have a plurality of bit lines, a plurality of word lines respectively intersecting said plurality of bit lines, and a plurality of memory cells respectively provided in association with portions where said plurality of bit lines and said plurality of word lines intersect, wherein sense amplifiers, each of which receives a first signal from one of a pair of bit lines extending to one of the memory array areas on one side adjacent to the respective sense amplifier areas and receives a second signal from the other of the pair of bit lines extending to another of the memory array areas on an opposite side adjacent to the respective sense amplifier areas, are provided within said respective sense amplifier areas, and wherein two of the memory array areas provided adjacent to each other constitute one of a plurality of banks, and means for reducing array noise on said bit lines, said means comprising independently controlling respective word-line selecting timings with respect to two banks, separated from each other with at least one of the plurality of banks interposed therebetween.

15. The semiconductor memory according to claim 14, wherein said means further comprises controlling the respective word-line selecting timings with respect to two of the banks adjacent to each other, of said plurality of banks, with displacements of predetermined periods.

* * * * *